US011961832B2

(12) United States Patent
Lee et al.

(10) Patent No.: US 11,961,832 B2
(45) Date of Patent: Apr. 16, 2024

(54) INTEGRATED CIRCUIT DEVICE

(71) Applicant: Samsung Electronics Co., Ltd., Suwon-si (KR)

(72) Inventors: Jina Lee, Hwaseong-si (KR); Hyungjoo Youn, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/144,889

(22) Filed: May 9, 2023

(65) Prior Publication Data

US 2023/0290768 A1    Sep. 14, 2023

Related U.S. Application Data

(63) Continuation of application No. 17/533,561, filed on Nov. 23, 2021, now Pat. No. 11,682,666, which is a
(Continued)

(30) Foreign Application Priority Data

Nov. 29, 2019   (KR) ......................... 10-2019-0157690

(51) Int. Cl.
*H01L 27/02*     (2006.01)
*H01L 21/02*     (2006.01)
(Continued)

(52) U.S. Cl.
CPC .... *H01L 27/0207* (2013.01); *H01L 21/02603* (2013.01); *H01L 21/823412* (2013.01); *H01L 21/823431* (2013.01); *H01L 21/823475* (2013.01); *H01L 21/823481* (2013.01); *H01L 27/0924* (2013.01); *H01L 29/0649* (2013.01); *H01L 29/0673* (2013.01);
(Continued)

(58) Field of Classification Search
CPC ............. H01L 27/0207; H01L 27/0924; H01L 27/088; H01L 27/0886; H01L 27/0203; H01L 21/02603; H01L 21/823412; H01L 21/823431; H01L 21/823475; H01L 21/823481; H01L 29/0649; H01L 29/0673; H01L 29/42392; H01L 29/78696
See application file for complete search history.

(56) References Cited

U.S. PATENT DOCUMENTS 8,772,056 B2   7/2014  Wang et al.
9,349,695 B2   5/2016  Hong et al.
(Continued)

FOREIGN PATENT DOCUMENTS

TW      I227945 B     2/2005

*Primary Examiner* — Dao H Nguyen
(74) *Attorney, Agent, or Firm* — Muir Patent Law, PLLC

(57) ABSTRACT

An integrated circuit device includes a substrate having a first intellectual property (IP) core including a cell region and a first edge dummy region, fin-type active regions protruding from the cell region, dummy fin-type active regions protruding from the first edge dummy region, gate lines extending, over the cell region of the substrate, the gate lines including two adjacent gate lines spaced apart from each other with a first pitch and two adjacent gate lines spaced apart with a second pitch greater than the first pitch, dummy gate lines over the first edge dummy region of the substrate and equally spaced apart from each other with the first pitch.

20 Claims, 20 Drawing Sheets

Related U.S. Application Data continuation of application No. 16/904,843, filed on Jun. 18, 2020, now Pat. No. 11,211,375.

(51) Int. Cl.
| | |
|---|---|
| *H01L 21/8234* | (2006.01) |
| *H01L 27/092* | (2006.01) |
| *H01L 29/06* | (2006.01) |
| *H01L 29/423* | (2006.01) |
| *H01L 29/66* | (2006.01) |
| *H01L 29/786* | (2006.01) |

(52) U.S. Cl.
CPC .. *H01L 29/42392* (2013.01); *H01L 29/66545* (2013.01); *H01L 29/6681* (2013.01); *H01L 29/78696* (2013.01)

(56) References Cited

U.S. PATENT DOCUMENTS

| | | |
|---|---|---|
| 9,385,048 B2 | 7/2016 | Hong et al. |
| 9,437,739 B2 | 9/2016 | Yu et al. |
| 9,653,466 B2 | 5/2017 | Yang et al. |
| 10,185,798 B2 | 1/2019 | Kim et al. |
| 10,217,742 B2 | 2/2019 | Oh et al. |
| 11,069,692 B2 * | 7/2021 | Liaw .................. H01L 27/0924 |
| 11,469,239 B1 * | 10/2022 | Desai ................. H01L 23/4824 |
| 2005/0056881 A1 | 3/2005 | Yeo et al. |
| 2013/0221491 A1 | 8/2013 | Wann et al. |
| 2014/0367780 A1 * | 12/2014 | Hong .................. H01L 23/562 |
| | | 257/288 |
| 2017/0033101 A1 | 2/2017 | Sharma et al. |
| 2017/0287909 A1 * | 10/2017 | Oh ........................ G06F 30/392 |
| 2017/0287933 A1 * | 10/2017 | Chen .................. H01L 27/0207 |
| 2020/0251476 A1 * | 8/2020 | Chang ................. H01L 23/528 |

\* cited by examiner

INTEGRATED CIRCUIT DEVICE

CROSS-REFERENCE TO RELATED APPLICATION

This application is a continuation application of U.S. application Ser. No. 17/533,561 filed on Nov. 23, 2021, which is a continuation application of U.S. application Ser. No. 16/904,843 filed on Jun. 18, 2020, which claims priority under 35 U.S.C. § 119 to Korean Patent Application No. 10-2019-0157690, filed on Nov. 29, 2019, in the Korean Intellectual Property Office, the disclosure of each of which is incorporated by reference herein in its entirety.

BACKGROUND

The inventive concept relates to an integrated circuit device, and more particularly, to an integrated circuit device including a fin-type active region.

Along with the development of electronic technology, integrated circuit devices have been rapidly down-scaled, and thus, line-widths and pitches of components of integrated circuit devices, for example, line-widths and pitches of fin-type active regions and gate lines, have been reduced.

Because integrated circuit devices require fast operation speed and operation accuracy, there is a need to develop techniques allowing components of integrated circuit devices to be formed with uniform line-widths and pitches even when the line-widths and pitches of the components thereof are reduced.

SUMMARY

The inventive concept provides an integrated circuit device having a structure allowing components thereof to be formed with uniform line-widths and pitches even when the line-widths and pitches of the components thereof are reduced along with down-scaling of the integrated circuit device.

According to an exemplary embodiment, an integrated circuit device includes a substrate having a first intellectual property (IP) core, which is defined by a separation region and comprises a first cell region and a first edge dummy region, a plurality of first fin-type active regions protruding in a vertical direction from the first cell region of the substrate and extending parallel to each other in a first horizontal direction, the plurality of first fin-type active regions including two adjacent first fin-type active regions that are spaced apart, in a second horizontal direction, from each other with a first pitch and two adjacent first fin-type active regions that are spaced apart, in the second horizontal direction, from each other with a second pitch greater than the first pitch, a plurality of first dummy fin-type active regions protruding in the vertical direction from the first edge dummy region of the substrate and extending parallel to each other in the first horizontal direction, the plurality of first dummy fin-type active regions being equally spaced apart from each other with the first pitch in the second horizontal direction, a plurality of first gate lines extending, over the first cell region of the substrate, parallel to each other in the second horizontal direction that intersects the first horizontal direction, and a plurality of first dummy gate lines extending, over the first edge dummy region of the substrate, parallel to each other in the second horizontal direction.

According to an exemplary embodiment of the present inventive concept, an integrated circuit device includes a substrate having an IP core, which is defined by a separation region and has at least two first edges extending in a first horizontal direction and at least two second edges extending in a second horizontal direction that intersects the first horizontal direction, the IP core comprising a cell region and an edge dummy region that is arranged to extend along the at least two second edges, a plurality of fin-type active regions protruding in a vertical direction from the substrate and extending parallel to each other in the first horizontal direction, a plurality of dummy fin-type active regions in the edge dummy region, a plurality of gate lines extending, over the substrate, parallel to each other in the second horizontal direction, which intersects the first horizontal direction, a plurality of dummy gate lines in the edge dummy region. In the edge dummy region, each of the plurality of dummy fin-type active regions intersects all of the plurality of dummy gate lines, and each of the plurality of dummy gate lines intersects all of the plurality of dummy fin-type active regions.

According to an exemplary embodiment of the present inventive concept, an integrated circuit device includes a substrate having an IP core, which is defined by a separation region and has at least two first edges extending in a first horizontal direction and at least two second edges extending in a second horizontal direction that intersects the first horizontal direction, the IP core including a cell region and an edge dummy region that is arranged to extend along the at least two second edges, a plurality of fin-type active regions on the cell region, the plurality of fin-type active regions protruding in a vertical direction from the cell region and extending parallel to each other in the first horizontal direction, and a plurality of dummy fin-type active regions on the edge dummy region, the plurality of dummy fin-type active regions protruding in the vertical direction from the edge dummy region and extending parallel to each other in the first horizontal direction, the plurality of fin-type active regions including two fin-type active regions adjacent to each other with a first pitch in the second horizontal direction, and two fin-type active regions adjacent to each other with a second pitch greater than the first pitch in the second horizontal direction, and the plurality of dummy fin-type active regions being arranged parallel to each other and equally spaced apart from each other with the first pitch in the second horizontal direction, a first device isolation film covering lower portions of sidewalls of the plurality of fin-type active regions and having a bottom surface at a first vertical level, a second device isolation film having a bottom surface at a second vertical level lower than the first vertical level and arranged to extend along a first portion of an edge of the edge dummy region, the first portion directly adjacent to the separation region, a plurality of gate lines extending, over the substrate, parallel to each other in the second horizontal direction, which intersects the first horizontal direction, and being equally spaced apart from each other with a third pitch in the first horizontal direction, and a plurality of dummy gate lines in the edge dummy region, the plurality of dummy gate lines being arranged parallel to each other and equally spaced apart from each other with the third pitch in the first horizontal direction.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
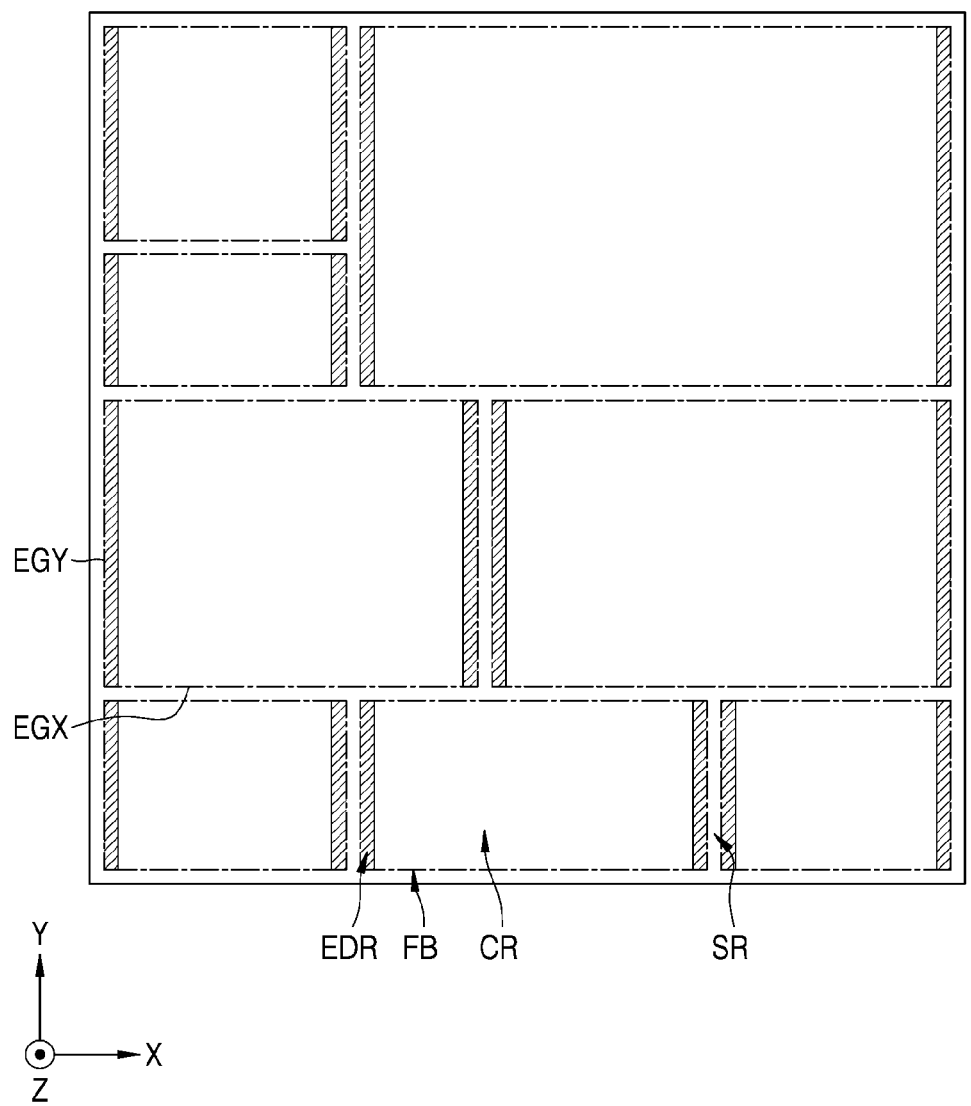
FIG. 1 is a planar layout diagram illustrating an integrated circuit device according to exemplary embodiments of the inventive concept.

FIG. 1 is a planar layout diagram illustrating an integrated circuit device according to exemplary embodiments of the inventive concept.

Referring to FIG. 1, an integrated circuit device 10 may include a plurality of function blocks FB defined by a separation region SR. The separation region SR may extend between the plurality of function blocks FB in a first horizontal direction (X direction) and a second horizontal direction (Y direction) that is perpendicular to the first horizontal direction (X direction). Each of the plurality of function blocks FB may correspond to an intellectual property (IP) core such as a main processing unit (MPU), a graphics processing unit (GPU), a communication unit, an interface, or the like. For example, the integrated circuit device 10 may include a system-on-chip (SoC) in which the plurality of function blocks FB each performing an independent function are implemented (i.e., integrated) into one chip. As used herein, intellectual property (IP) core may be used to denote self-contained discrete units that provide a macro function to the system. Those skilled in the art will appreciate that the disclosed intellectual property core is physically implemented by electronic (or optical) circuits, such as logic circuits, discrete components, microprocessors, hard-wired circuits, memory elements, wiring connections, buses, communication links, and the like, which may be formed using semiconductor-based fabrication techniques or other manufacturing technologies. In designing various integrated circuits, the IP core may be reusable to design them.

In some exemplary embodiments, all or some of the plurality of function blocks FB may each include a plurality of logic cells. Each logic cell may include a plurality of circuit elements such as a transistor, a register, and the like in various configurations. Each logic cell may constitute, for example, a logic gate such as an AND gate, a NAND gate, an OR gate, a NOR gate, an exclusive OR (XOR) gate, an exclusive NOR (XNOR) gate, an inverter (INV), an adder (ADD), a buffer (BUF), a delay (DLY), a filter (FIL), a multiplexer (MXT/MXIT), an OR/AND/INVERTER (OAI), an AND/OR (AO), an AND/OR/INVERTER (AOI), a D flip-flop, a reset flip-flop, a master-slave flip-flop, a latch, or the like, and each logic cell may also constitute a standard cell, such as a counter, a buffer, or the like, which performs an intended logical function.

In some exemplary embodiments, some of the plurality of function blocks FB may each be a memory unit having a memory cell array. The memory cell array may include, for example, an array including memory cells having a large capacity of several hundred megabytes (Mbytes) to several gigabytes (Gbytes) or more. Each memory cell may include a volatile memory cell, a non-volatile memory cell, or a read-only memory (ROM) cell. The volatile memory cell may include, for example, a static random access memory (SRAM) and/or a dynamic RAM (DRAM). The non-volatile memory cell may include, for example, a magneto-resistive RAM (MRAM), a phase-change RAM (PRAM), a resistive RAM (RRAM), and/or a flash memory. The ROM cell may include, for example, a programmable ROM (PROM) or an electrically erasable programmable ROM (EEPROM).

In some exemplary embodiments, some of the plurality of function blocks FB may each include both a plurality of logic cells and a plurality of memory cells.

Each function block FB may have, in a plan view, a polygonal shape which has at least two first edges EGX extending in the first horizontal direction (X direction) and at least two second edges EGY extending in the second horizontal direction (Y direction). In some exemplary embodiments, each of the plurality of function blocks FB may have a rectangular shape in a plan view. The first horizontal direction (X direction) may be a lengthwise direction of a fin-type active region (FA of FIG. 5), and the second horizontal direction (Y direction) may be a lengthwise direction of a gate line (GL of FIG. 5).

Each of the plurality of function blocks FB may include a cell region, and at least two edge dummy regions EDR that are arranged along at least two edges of each function block FB, respectively. In an exemplary embodiment, two edge dummy regions EDR of each function block EB may be spaced apart from each other in the first horizontal direction, and each of the two edge dummy regions EDR may extend in the second horizontal direction. The present invention is not limited thereto. In some exemplary embodiments, at least two edge dummy regions EDR of each function block FB may have the same configuration (e.g., the same locations where the dummy regions EDR are placed and the same lengthwise direction). In some exemplary embodiments, some of the plurality of function blocks FB may have no edge dummy regions EDR.

The cell region CR may be a region in which a plurality of transistors for constituting a logic cell and/or a memory cell are arranged. For example, a plurality of fin field effect transistors (FinFETs) may be arranged in the cell region CR.

The edge dummy region EDR may be arranged to extend along a second edge EGY of each function block FB. A plurality of gate lines GL and a plurality of fin-type active regions FA may be arranged in the edge dummy region EDR such that the plurality of gate lines GL intersect with the plurality of fin-type active regions FA. A gate line GL and a fin-type active region FA, which are arranged in the edge dummy region EDR, may be a dummy gate line and a dummy fin-type active region, respectively. The plurality of gate lines GL and the plurality of fin-type active regions FA, which are arranged in the edge dummy region EDR, will be described in detail with reference to FIGS. 5 to 10, 19, and 20. As used herein, the term "dummy" is used to refer to a component that has the same or similar structure and shape as other components but does not have a substantial function and exists only as a pattern in the device.

The edge dummy region EDR may not be arranged to extend along a first edge EGX of each function block FB. Here, that the edge dummy region EDR is not arranged to extend along the first edge EGX of each function block FB and is arranged to extend along the second edge EGY of each function block FB means that the edge dummy region EDR is not arranged in the first edge EGX except in a portion of the first edge EGX, which is adjacent to the second edge EGY. For example, although an end of the edge dummy region EDR arranged to extend along the second edge EGY may extend to the portion of the first edge EGX, which is adjacent to the second edge EGY, the end of the edge dummy region EDR arranged to extend along the second edge EGY may not extend along the remaining portion of the first edge EGX.

Although FIG. 1 illustrates that the edge dummy region EDR is arranged in all the second edges EGY of each of the plurality of function blocks FB included in the integrated circuit device 10, the inventive concept is not limited thereto. In some embodiments, the edge dummy region EDR may not be arranged in function blocks FB having no fin-type active region FA among the plurality of function blocks FB, for example, in function blocks FB in which a FinFET is not arranged. For example, in the function blocks FB in which the edge dummy region EDR is not arranged, the FinFET may not be arranged. Instead, a plurality of planar transistors may be arranged.

Figure 2:
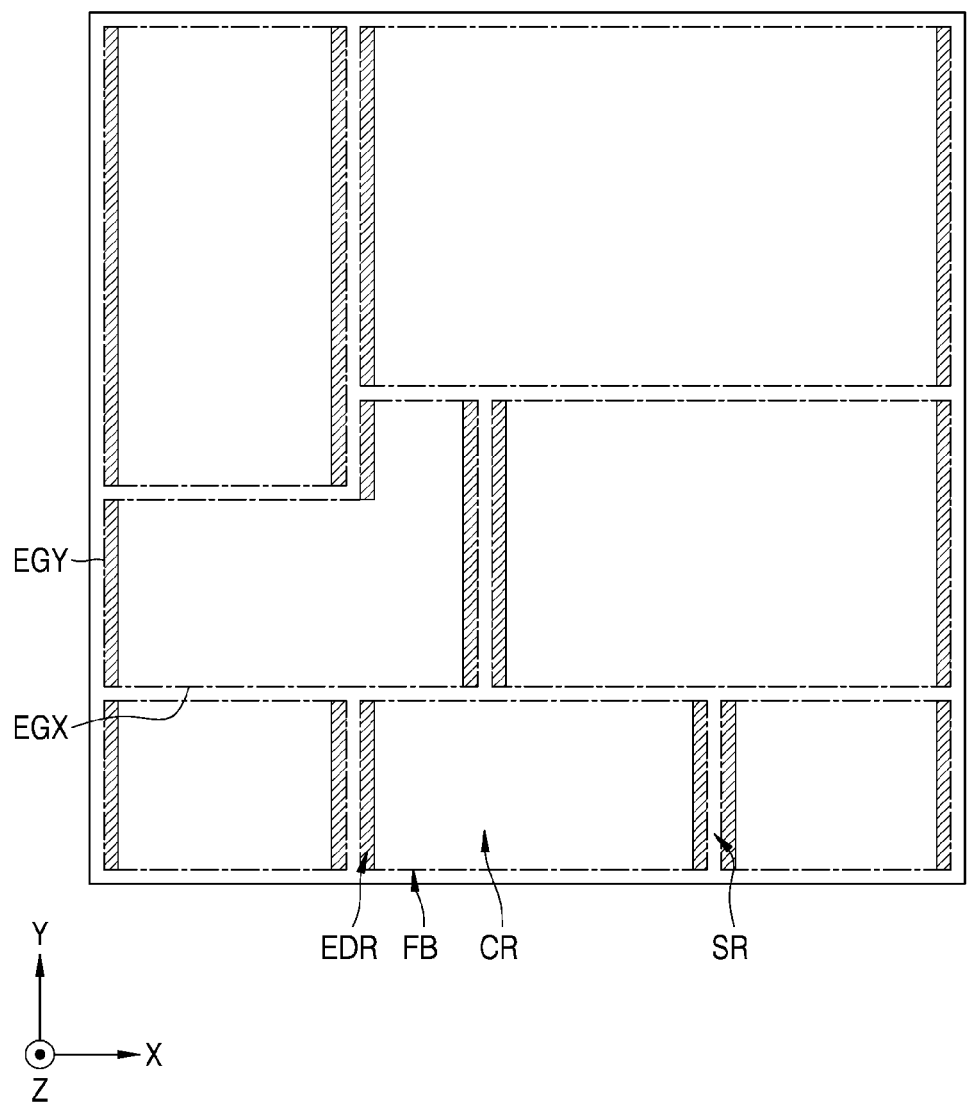
FIG. 2 is a planar layout diagram illustrating an integrated circuit device according to exemplary embodiments of the inventive concept.

FIG. 2 is a planar layout diagram illustrating an integrated circuit device according to exemplary embodiments of the inventive concept. Regarding FIG. 2, the same reference numerals of FIG. 1 respectively denote the same members, and repeated descriptions given with reference to FIG. 1 may be omitted.

Referring to FIG. 2, an integrated circuit device 10a may include the plurality of function blocks FB defined by the separation region SR. Each function block FB may have, in a plan view, a polygonal shape which has at least two first edges EGX extending in the first horizontal direction (X direction) and at least two second edges EGY extending in the second horizontal direction (Y di recti on).

For example, some of the plurality of function blocks FB may each have a rectangular shape in a plan view, and the others may each have a polygonal shape having three or more first edges EGX and three or more second edges EGY. For the convenience of description, FIG. 2 illustrates that one of the plurality of function blocks FB has an L-shaped polygonal shape. The inventive concept, however, is not limited thereto. In an exemplary embodiment, at least some of the plurality of function blocks FB may have various polygonal shapes such as L-shapes, U-shapes, T-shapes, and the like.

In some of the plurality of function blocks FB, one of the first edges EGX and the second edges EGY in one function block FB may be adjacent to a corresponding same-type edge in the other function block FB adjacent thereto, and in some others of the plurality of function blocks FB, at least two of the first edges EGX and the second edges EGY in one function block FB may respectively face at least two corresponding same-type edges in the other function block FB adjacent thereto.

Each of the plurality of function blocks FB may include the cell region CR and the edge dummy region EDR that is arranged along a portion of the edge of each function block FB. In some embodiments, some of the plurality of function blocks FB may have no edge dummy region EDR.

The edge dummy region EDR may be arranged to extend along the second edge EGY of the function block FB. The edge dummy region EDR may not be arranged to extend along the first edge EGY of the function block FB. For example, when the function block FB has, in a plan view, a polygonal shape having three or more first edges EGX and three or more second edges EGY, the edge dummy region EDR may be arranged to extend along each of the three or more second edges EGY of the function block FB.

Figure 3:
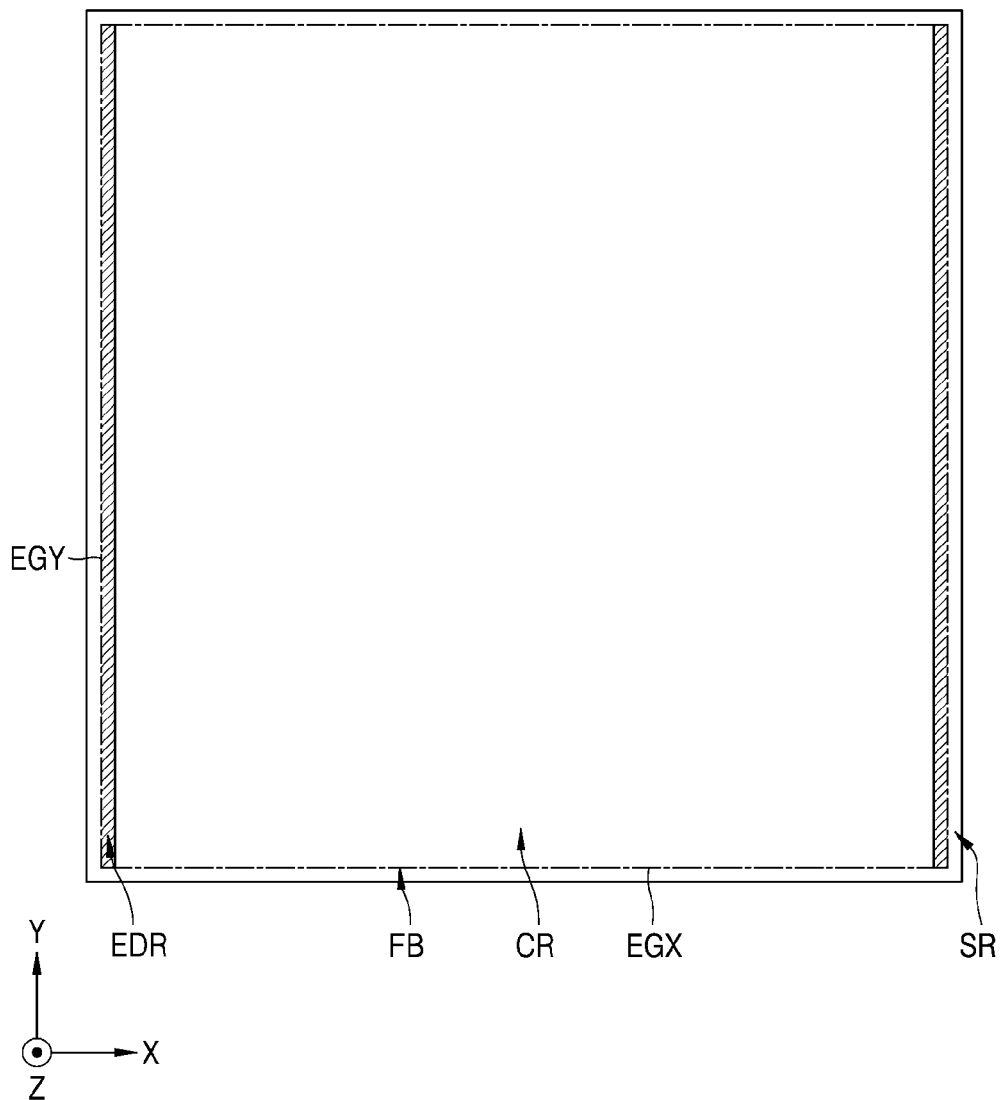
FIG. 3 is a planar layout diagram illustrating an integrated circuit device according to exemplary embodiments of the inventive concept.

FIG. 3 is a planar layout diagram illustrating an integrated circuit device according to exemplary embodiments of the inventive concept. Regarding FIG. 3, the same reference numerals as in FIGS. 1 and 2 denote substantially the same members, and repeated descriptions given with reference to FIGS. 1 and 2 may be omitted.

Referring to FIG. 3, an integrated circuit device 10b may include one function block FB defined by the separation region SR. For example, the integrated circuit device 10b may include a logic semiconductor chip. In some exemplary embodiments, the integrated circuit device 10b may include a central processing unit (CPU), a controller, an application-specific integrated circuit (ASIC), or the like.

The separation region SR may extend along an edge of the integrated circuit device 10b in the first horizontal direction (X direction) and the second horizontal direction (Y direction).

The function block FB may include the cell region CR and the edge dummy region EDR that is arranged along a portion of the edge of the function block FB. The cell region CR may be a region in which a plurality of transistors for constituting a logic cell are arranged. For example, a plurality of FinFETs may be arranged in the cell region CR.

The function block FB may have, in a plan view, a rectangular shape which has two first edges EGX extending in the first horizontal direction (X direction) and two second edges EGY extending in the second horizontal direction (Y direction).

The edge dummy region EDR may be arranged to extend along each of the two second edges EGY of the function block FB. The edge dummy region EDR may not be arranged to extend along the two first edges EGX of the function block FB.

Figure 4:
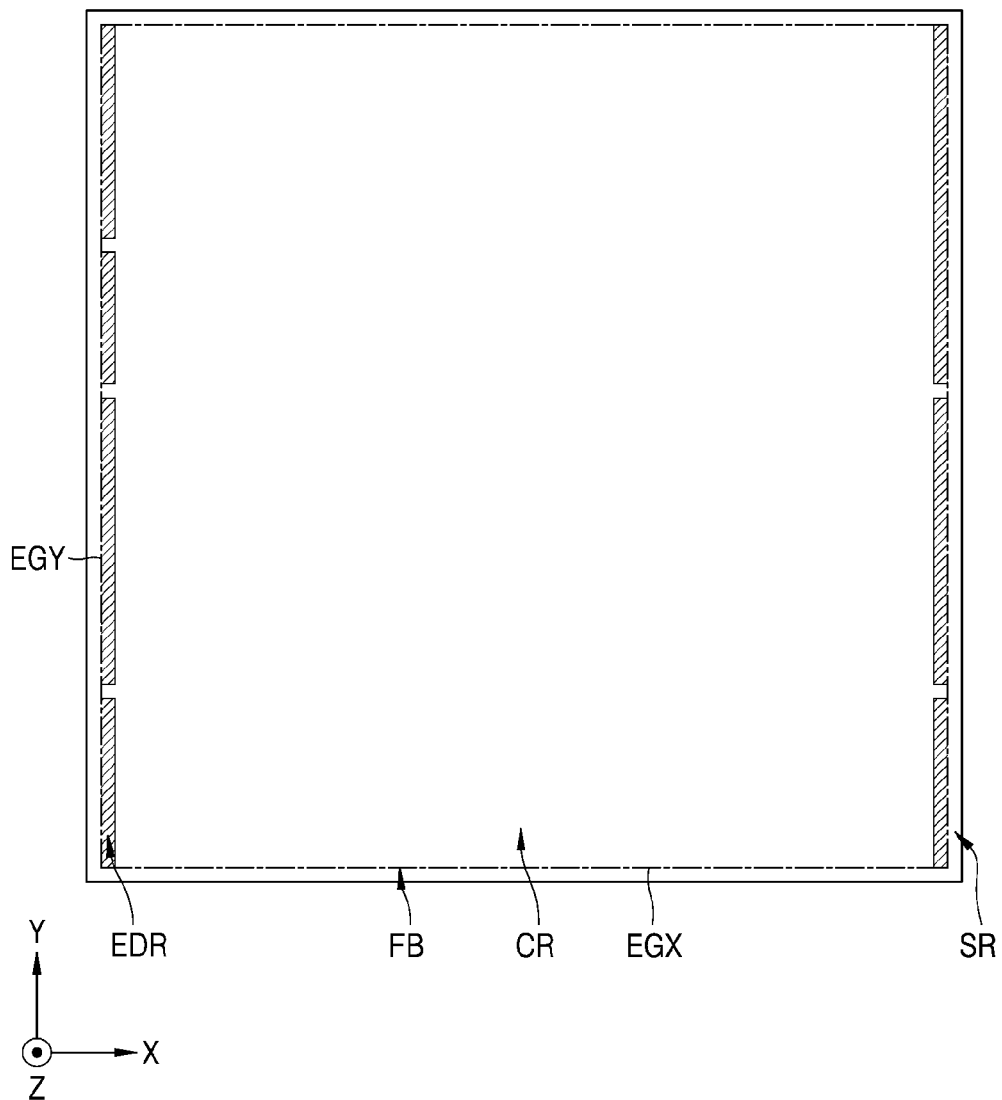
FIG. 4 is a planar layout diagram illustrating an integrated circuit device according to exemplary embodiments of the inventive concept.

FIG. 4 is a planar layout diagram illustrating an integrated circuit device according to embodiments of the inventive concept. Regarding FIG. 4, the same reference numerals as in FIGS. 1 to 3 respectively denote substantially the same members, and repeated descriptions given with reference to FIGS. 1 to 3 may be omitted.

Referring to FIG. 4, an integrated circuit device 10c may include one function block FB defined by the separation region SR. For example, the integrated circuit device 10c may include a logic semiconductor chip.

The separation region SR may extend along an edge of the integrated circuit device 10c in the first horizontal direction (X direction) and the second horizontal direction (Y direction). For example, the separation region SR may surround the cell region CR.

The function block FB may include the cell region CR and the edge dummy region EDR that is arranged along a portion of the edge of the function block FB. The cell region CR may be a region in which a plurality of transistors for constituting a logic cell are arranged. For example, a plurality of FinFETs may be arranged in the cell region CR.

The function block FB may have, in a plan view, a rectangular shape which has two first edges EGX, opposite to each other in the second horizontal direction (Y direction), extending in the first horizontal direction (X direction) and two second edges EGY, opposite to each other in the first horizontal direction (X direction), extending in the second horizontal direction (Y di recti on).

The edge dummy region EDR may be arranged to extend along each of the two second edges EGY of the function block FB. The edge dummy region EDR may include a plurality of edge dummy regions EDR spaced apart from each other to extend along at least one of the two second edges EGY of the function block FB. The edge dummy region EDR may not be arranged to extend along the two first edges EGX of the function block FB.

Although the edge dummy region EDR is shown in FIGS. 1 and 3 as extending continuously along the whole second edge EGY of each of the plurality of function blocks FB, the inventive concept is not limited thereto. In an exemplary embodiment, in the integrated circuit device 10c as shown in FIG. 4, the plurality of edge dummy regions EDR may be spaced apart from each other to extend along at least one second edge EGY of at least one of the plurality of function blocks FB.

Figure 5:
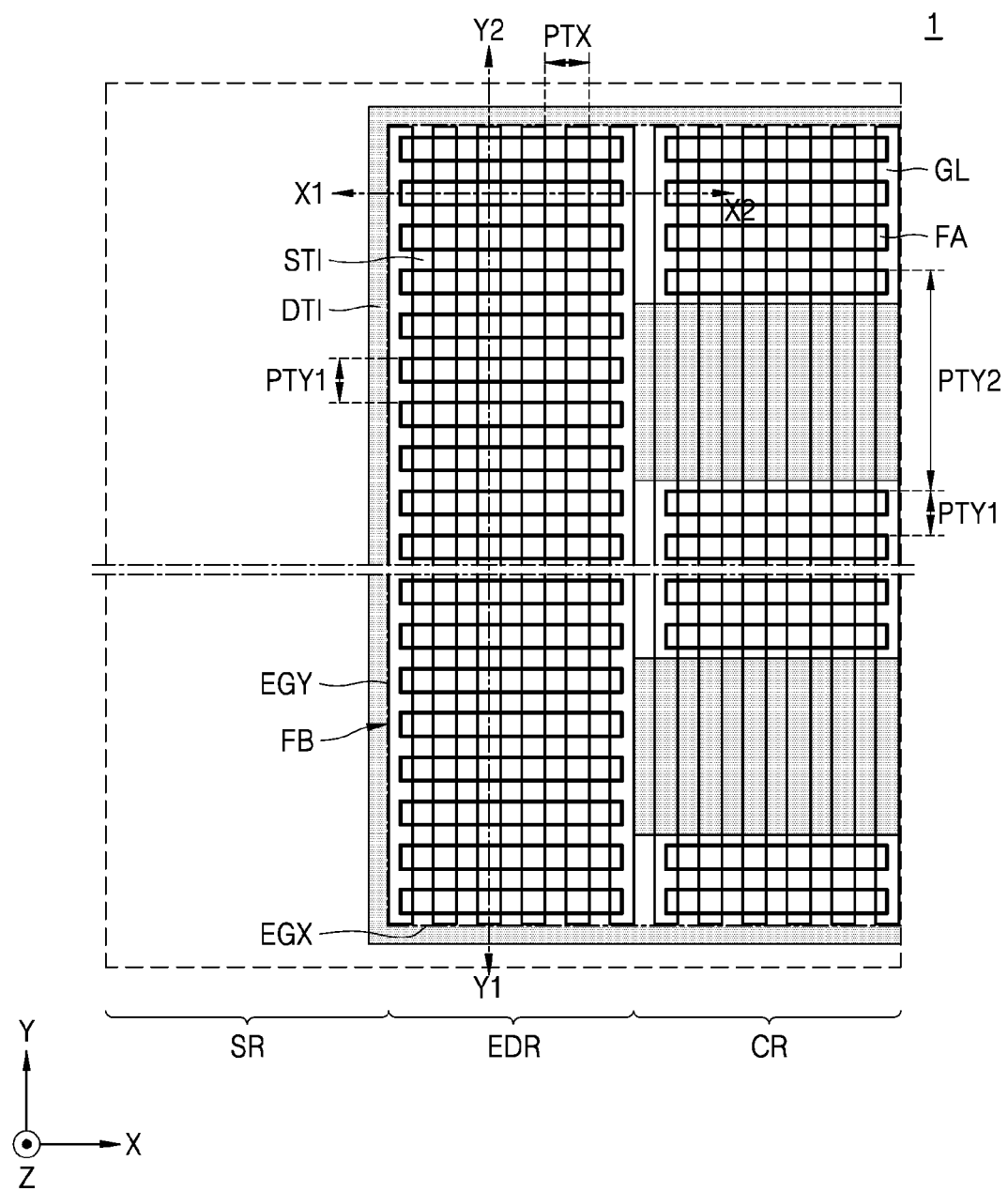
FIG. 5 is an enlarged planar layout diagram illustrating a portion of an integrated circuit device according to exemplary embodiments of the inventive concept.

FIG. 5 is an enlarged planar layout diagram illustrating a portion of an integrated circuit device according to embodiments of the inventive concept. FIG. 5 is an enlarged planar layout diagram illustrating a portion of the function block FB, in which the second edge EGY is arranged along an edge of each of the integrated circuit devices 10, 10a, and 10b, the function block FB having been shown in FIGS. 1 to 3, and, regarding FIG. 5, the same reference numerals as in FIGS. 1 to 3 respectively denote substantially the same members and repeated descriptions given with reference to FIGS. 1 to 3 may be omitted.

Referring to FIG. 5, an integrated circuit device 1 may include at least one function block FB defined by the separation region SR. In the function block FB, the plurality of fin-type active regions FA extending in the first horizontal direction (X direction), and the plurality of gate lines GL extending over the plurality of fin-type active regions FA in the second horizontal direction (Y direction) and intersecting at least one of the plurality of fin-type active regions FA, may be arranged. The plurality of fin-type active regions FA may be spaced apart from each other in the second horizontal direction, and the plurality of gate lines GA may be spaced apart from each other in the first horizontal direction.

The function block FB may include the cell region CR and the edge dummy region EDR that is arranged along a portion of the edge of the function block FB. The cell region CR may be a region in which a plurality of transistors for constituting a logic cell and/or a memory cell are arranged. For example, a plurality of FinFETs may be arranged in the cell region CR. The edge dummy region EDR may be arranged to extend along the second edge EGY of the function block FB.

At least some of the plurality of fin-type active regions FA in the cell region CR and at least some of the plurality of gate lines GL in the cell region CR may be real fin-type active regions and real gate lines, respectively. Although all the plurality of fin-type active regions FA and all the plurality of gate lines GL, which are arranged in the cell region CR shown in FIG. 5, may be respectively real fin-type active regions and real gate lines, the inventive concept is not limited thereto. In some embodiments, some others of the plurality of fin-type active regions FA in the cell region CR and some others of the plurality of gate lines GL in the cell region CR may be dummy fin-type active regions and dummy gate lines, respectively.

For example, all the plurality of fin-type active regions FA and all the plurality of gate lines GL, which are arranged in the edge dummy region EDR, may be dummy fin-type active regions and dummy gate lines, respectively.

Hereinafter, unless particularly stated for description convenience, the fin-type active region FA and the gate line GL, which are arranged in the cell region CR, may be respectively referred to as a real fin-type active region FA and a real gate line GL, and the fin-type active region FA and the gate line GL, which are arranged in the edge dummy region EDR, may be respectively referred to as a dummy fin-type active region FA and a dummy gate line GL. However, although a plurality of dummy fin-type active regions and a plurality of dummy gate lines may also be further arranged in the cell region CR even without separate descriptions, geometric features, such as line-widths and/or pitches, of the plurality of dummy fin-type active regions and the plurality of dummy gate lines, which are arranged in the cell region CR, are not limited to descriptions of geometric features, such as line-widths and/or pitches, of the plurality of dummy fin-type active regions FA and the plurality of dummy gate lines GL, which are arranged in the edge dummy region EDR, and the geometric features thereof in the cell region CR may have other various values.

The plurality of fin-type active regions FA arranged in one edge dummy region EDR, for example, the plurality of dummy fin-type active regions FA, may extend parallel to each other in the first horizontal direction (X direction), and the plurality of gate lines GL arranged in one edge dummy region EDR, for example, the plurality of dummy gate lines GL, may extend parallel to each other in the second horizontal direction (Y direction). The plurality of dummy fin-type active regions FA may be arranged parallel to each other and equally spaced apart from each other with a first pitch PTY1 in the second horizontal direction (Y direction). The plurality of dummy gate lines GL may be arranged parallel to each other and equally spaced apart from each other with a second pitch PTX in the first horizontal direction (X direction). The first pitch PTY1 refers to a distance between an upper edge of a fin-type active region and an upper edge of another fin-type active region adjacent thereto. The first pitch PTY1 may be the same as the center-to-center distance of two fin-type active regions adjacent to each other.

In some embodiments, in one edge dummy region EDR, each of the plurality of dummy fin-type active regions FA may intersect all of the plurality of dummy gate lines GL, and each of the plurality of dummy gate lines GL may intersect all of the plurality of dummy fin-type active regions FA.

The plurality of fin-type active regions FA in the cell region CR (i.e., a plurality of real fin-type active regions FA) may extend parallel to each other in the first horizontal direction (X direction), and the plurality of gate lines GL in the cell region CR (i.e., a plurality of real gate lines GL) may extend parallel to each other in the second horizontal direction (Y direction). Some of the plurality of real fin-type active regions FA may be arranged parallel to each other and spaced apart from each other with the first pitch PTY1 in the second horizontal direction (Y direction), whereas at least two others thereof may be arranged parallel to each other and spaced apart from each other with a third pitch PTY2 greater than the first pitch PTY1. At least some of the plurality of real gate lines GL may be arranged parallel to each other and spaced apart from each other with the second pitch PTX in the second horizontal direction (Y direction) and, although not shown separately, at least two others thereof may be arranged parallel to each other and spaced apart from each other with a pitch greater than the second pitch PTX.

In an exemplary embodiment, although all the plurality of dummy fin-type active regions FA in one edge dummy region EDR may be arranged parallel to each other and spaced apart from each other with the first pitch PTY1, some of the plurality of real fin-type active regions FA in the cell region CR may be arranged parallel to each other and spaced apart from each other with the first pitch PTY1, and some others thereof may be arranged parallel to each other and spaced apart from each other a pitch greater than the first pitch PTY1, for example, the third pitch PTY2 or a pitch of another value. In addition, although all the plurality of dummy gate lines GL in one edge dummy region EDR may be arranged parallel to each other and equally spaced apart from each other with the second pitch PTX, the plurality of real gate lines GL in the cell region CR may be arranged parallel to each other and spaced apart from each other with the second pitch PTY2, or may be arranged parallel to each other and be spaced apart from each other with a pitch of another value which is greater than the second pitch PTY2.

All the plurality of dummy fin-type active regions FA in one edge dummy region EDR may have the same length in the first horizontal direction (X direction), and all the plurality of dummy gate lines GL in the one edge dummy region EDR may have the same length in the second horizontal direction (Y direction).

For the simplicity of drawings, FIG. 5 shows that all the plurality of real fin-type active regions FA in the cell region CR have the same length in the first horizontal direction (X direction), and all the plurality of dummy gate lines GL in the cell region CR have the same length in the second horizontal direction (Y direction). The present invention is not limited thereto. In an exemplary embodiment, the plurality of real fin-type active regions FA in the cell region CR may have lengths of various values in the first horizontal direction (X direction), and the plurality of real gate lines GL in the cell region CR may have lengths of various values in the second horizontal direction (Y direction).

In the edge dummy region EDR, a first device isolation film STI may be arranged between the plurality of fin-type active regions FA. In the cell region CR, the first device isolation film STI may be arranged in portions of spaces between the plurality of fin-type active regions FA, and a second device isolation film DTI may be arranged in the other portions thereof. A bottom surface of the second device isolation film DTI may have a lower level than a bottom surface of the first device isolation film STI, and in a vertical direction (Z direction), a height of the second device isolation film DTI may be greater than a height of the first device isolation film STI. In some embodiments, a top surface of the first device isolation film STI and a top surface of the second device isolation film DTI may have a substantially equal level. This will be further described with reference to FIGS. 11 to 19.

The second device isolation film DTI may be further arranged in the separation region SR along the edge of the function block FB to surround the periphery of the function block FB.

The second device isolation film DTI may extend to surround one edge of one edge dummy region EDR, which extends in the second horizontal direction (Y direction) and faces the separation region SR, that is, the second edge EGY of the function block FB, and all edges thereof which extend in the first horizontal direction (X direction) and face the separation region SR. In an exemplary embodiment, the second device isolation film DTI may extend to surround the function block FB. For example, a first edge (i.e., the second edge EGY of the function block FB) of the dummy region EDR, which extends in the second horizontal direction (Y direction), is directly adjacent to the separation region SR, and two second edges (i.e., each second edge corresponding to a first edge EGX of the function block FB) thereof which extend in the first horizontal direction (X direction), are directly adjacent to the separation region SR. The first device isolation film STI may extend to partially surround a third edge, opposite to the first edge in the first horizontal direction, of the edge dummy region EDR, which extends in the second horizontal direction (Y direction) and is directly adjacent to the cell region CR. In some exemplary embodiments, the first device isolation film STI may extend to surround all portions of the third edge of the edge dummy region EDR, which extends in the second horizontal direction (Y direction) and is directly adjacent to the cell region CR. In some exemplary embodiments, the first device isolation film STI may extend to surround a portion of the third edge of the edge dummy region EDR, which extends in the second horizontal direction (Y direction) and is directly adjacent to the cell region CR, and the second device isolation film DTI may extend to surround the remaining edges (e.g., the first edge and the two second edges) of the edge dummy region EDR. In an exemplary embodiment, the first device isolation film STI may surround each of the plurality of dummy fin-type active regions FA. In an exemplary embodiment, the first device isolation film STI may be connected to the second device isolation film DTI.

The plurality of real gate lines GL arranged in the cell region CR among the plurality of gate lines GL included in the function block FB may be formed to have line-widths and/or pitches which are precisely transferred from patterns of a photomask during a photolithography process and an etching process, due to the plurality of dummy gate lines GL arranged in the edge dummy region EDR. However, because there is no other gate line in the separation region SR, the plurality of dummy gate lines GL in the edge dummy region EDR may have line-widths and/or pitches deviated from patterns of a photomask and thus may have non-uniform line-widths and/or pitches, and accordingly, at least some of the plurality of dummy gate lines GL may suffer from lifting and thus cause defects. Such non-uniformity of the etching process may be caused by a loading effect which refers to the dependence of etch rate on the quantity of material being etched, for example, in a plasma etching process.

However, in the case of the plurality of dummy gate lines GL included in the integrated circuit device 1 according to embodiments of the inventive concept, because there are the plurality of dummy fin-type active regions FA, which have the same first pitch PTY1 and the same extension length, under the plurality of dummy gate lines GL, the uniformity of line-widths and/or pitches may be secured and the issue of lifting may not occur. For example, the plurality of dummy fin-type active regions FA may be arranged on the dummy edge region EDR, and the plurality of dummy gate lines GL on the dummy edge region EDR may be arranged with the same first pitch PTY1 and the same length of the plurality of dummy gate lines GL, and the plurality of dummy gate lines GL are arranged to intersect the plurality of dummy gate lines GL. In this case, the uniformity of line-widths and/or pitches of the plurality of dummy gate lines GL may be secured to the extent that lifting thereof may not occur. Therefore, the integrated circuit device 1 according to exemplary embodiments of the inventive concept may prevent defects, which may be caused by lifting of the dummy gate lines GL, and thus secure reliability.

Figure 6:
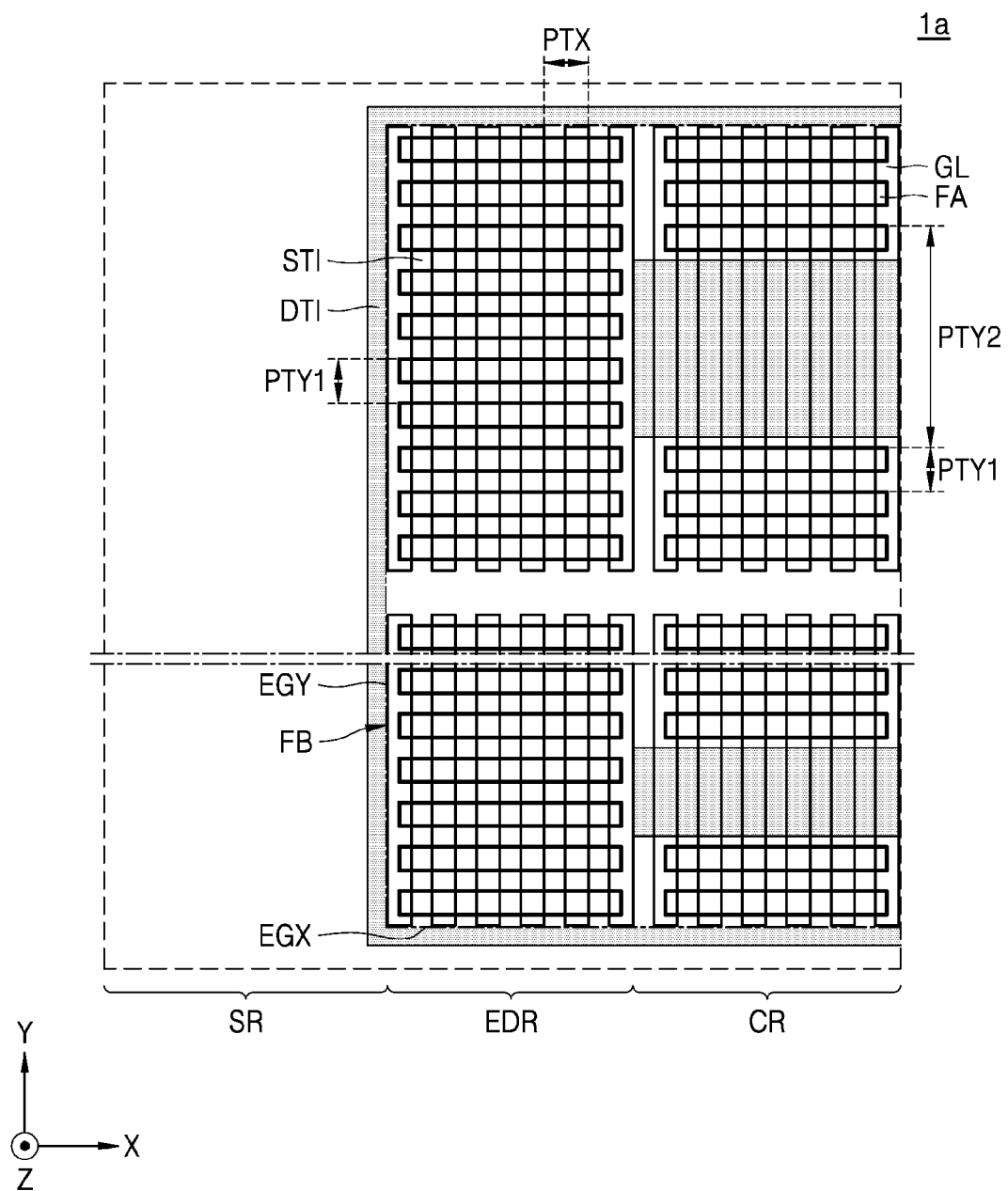
FIG. 6 is an enlarged planar layout diagram illustrating a portion of an integrated circuit device according to exemplary embodiments of the inventive concept.

FIG. 6 is an enlarged planar layout diagram illustrating a portion of an integrated circuit device according to embodiments of the inventive concept. FIG. 6 is an enlarged planar layout diagram illustrating a portion of the function block FB, in which the second edge EGY is arranged along the edge of the integrated circuit devices 10c, the function block FB having been shown in FIG. 4, and, regarding FIG. 6, the same reference numerals as in FIGS. 4 and 5 respectively denote substantially the same members and repeated descriptions given with reference to FIGS. 4 and 5 may be omitted.

Referring to FIG. 6, an integrated circuit device 1a may have at least one function block FB defined by the separation region SR. The function block FB may include the cell region CR, and the edge dummy region EDR arranged along a portion of the edge of the function block FB. The edge dummy region EDR may include a plurality of edge dummy regions EDR spaced apart from each other along the second edge EGY of the function block FB.

In some embodiments, between the plurality of edge dummy regions EDR spaced apart from each other along the second edge EGY of the function block FB, the first device isolation film STI may be arranged between the plurality of dummy fin-type active regions FA. The second device isolation film DTI may extend to surround a first edge (i.e., the second edge EGY of the function block FB) of the edge dummy region EDR, which extends in the second horizontal direction (Y direction) and is directly adjacent to the separation region SR, and each of two second edges of the edge dummy region which extends in the first horizontal direction (X direction) and is directly adjacent to the separation region SR. The first device isolation film STI may extend to surround at least a third edge, opposite to the first edge, of the edge dummy region EDR, which extends in the second horizontal direction (Y direction) and is directly adjacent to the cell region CR.

Figure 7:
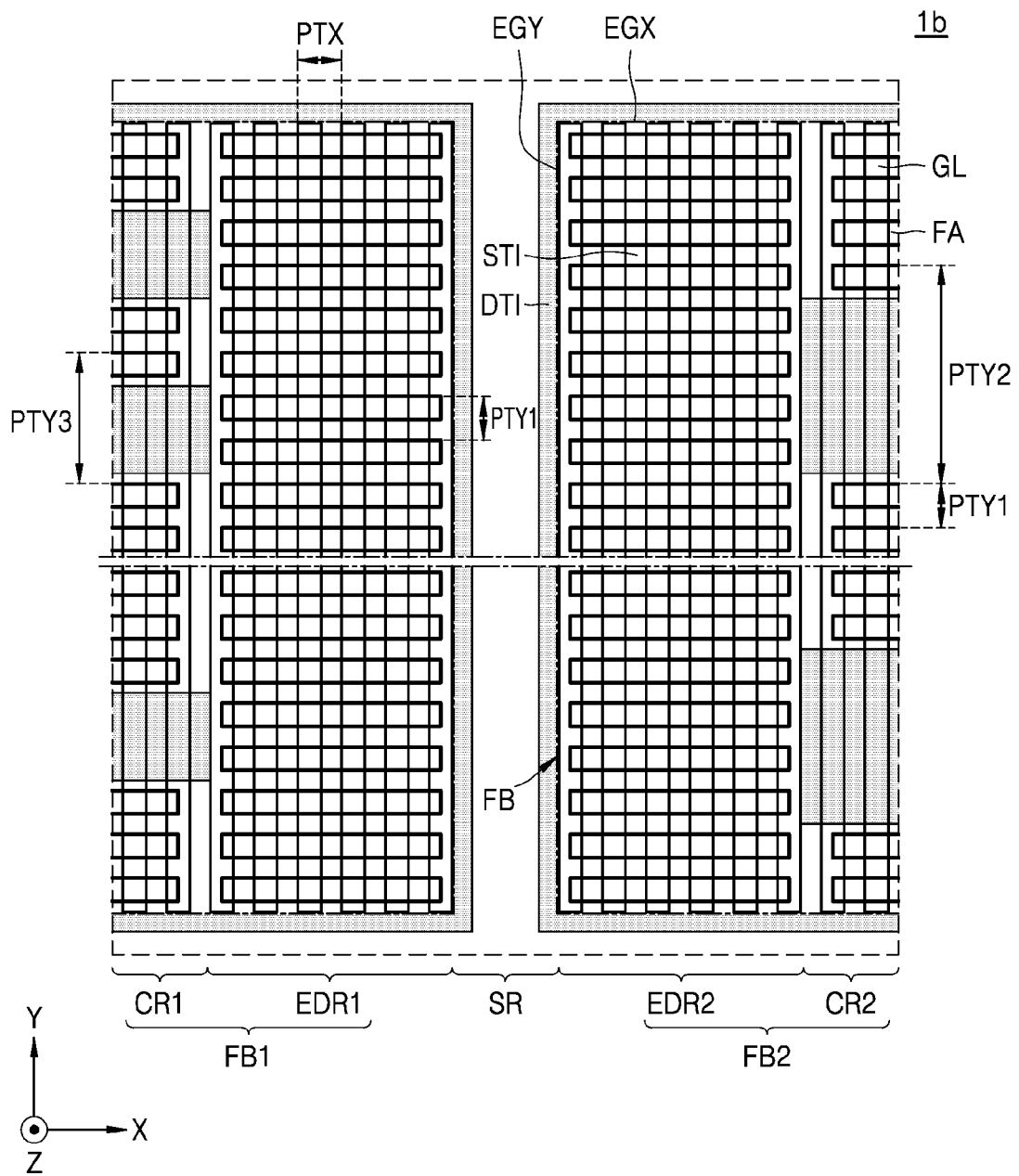
FIG. 7 is an enlarged planar layout diagram illustrating a portion of an integrated circuit device according to exemplary embodiments of the inventive concept.

FIG. 7 is an enlarged planar layout diagram illustrating a portion of an integrated circuit device according to exemplary embodiments of the inventive concept. FIG. 7 is an enlarged planar layout diagram illustrating respective portions of two function blocks FB which are adjacent to each other and have been shown in FIGS. 1 and 2, and regarding FIG. 7, the same reference numerals as shown in FIGS. 1, 2, and 5 denote substantially the same members and repeated descriptions given with reference to FIGS. 1, 2, and 5 may be omitted.

Referring to FIG. 7, an integrated circuit device 1b may have the plurality of function blocks FB defined by the separation region SR. Each of the plurality of function blocks FB may include the cell region CR and the edge dummy region EDR that is arranged along a portion of the edge of the function block FB. The edge dummy region EDR may include a plurality of edge dummy regions EDR arranged apart from each other along the second edge EGY of the function block FB. For the convenience of description, it is assumed that the integrated circuit device 1b includes a first function block FB1 and a second function block FB2 adjacent thereto. The first function block FB1 may include a first cell region CR1 and a first edge dummy region EDR1 that is arranged along a portion of the edge of the first function block FB1. The second function block FB2 may include a second cell region CR2 and a second edge dummy region EDR2 that is arranged along a portion of the edge of the second function block FB2.

The first dummy region EDR1 may be spaced apart from the second dummy region EDR2.

Although some of the plurality of real fin-type active regions FA may be arranged parallel to each other while equally having the first pitch PTY1 in the first horizontal direction (X direction), at least two others thereof may be arranged parallel to each other while having the third pitch PTY2 greater than the first pitch PTY1, and at least two others thereof may be arranged parallel to each other while having a fourth pitch PTY3 that is greater than the first pitch PTY1 and different from the third pitch PTY2. In an exemplary embodiment, some of the plurality of real fin-type active regions FA in the second function block FB2 may be arranged parallel to each other and equally spaced apart from each other with the first pitch PTY1 in the second horizontal direction (Y direction), and at least two others thereof may be arranged parallel to each other and spaced apart from each other with the third pitch PTY2, in the second horizontal direction, greater than the first pitch PTY1. Some of the plurality of real fin-type active regions FA in the first function block FB1 may be arranged parallel to each other and equally spaced apart from each other with the first pitch PTY1 in the second horizontal direction (Y direction), and at least two others thereof may be arranged parallel to each other and spaced apart from each other with a fourth pitch PTY3 in the second horizontal direction that is greater than the first pitch PTY1 and different from the third pitch PTY2. In an exemplary embodiment, the fourth pitch PTY3 may be smaller than the third pitch PTY2.

The second device isolation film DTI may extend to surround the second edge EGY of each of the first function block FB1 and the second function block FB2. The second device isolation film DTI of the first function block FB1 and the second device isolation film DTI of the second function block FB2 may be spaced apart from each other.

Figure 8:
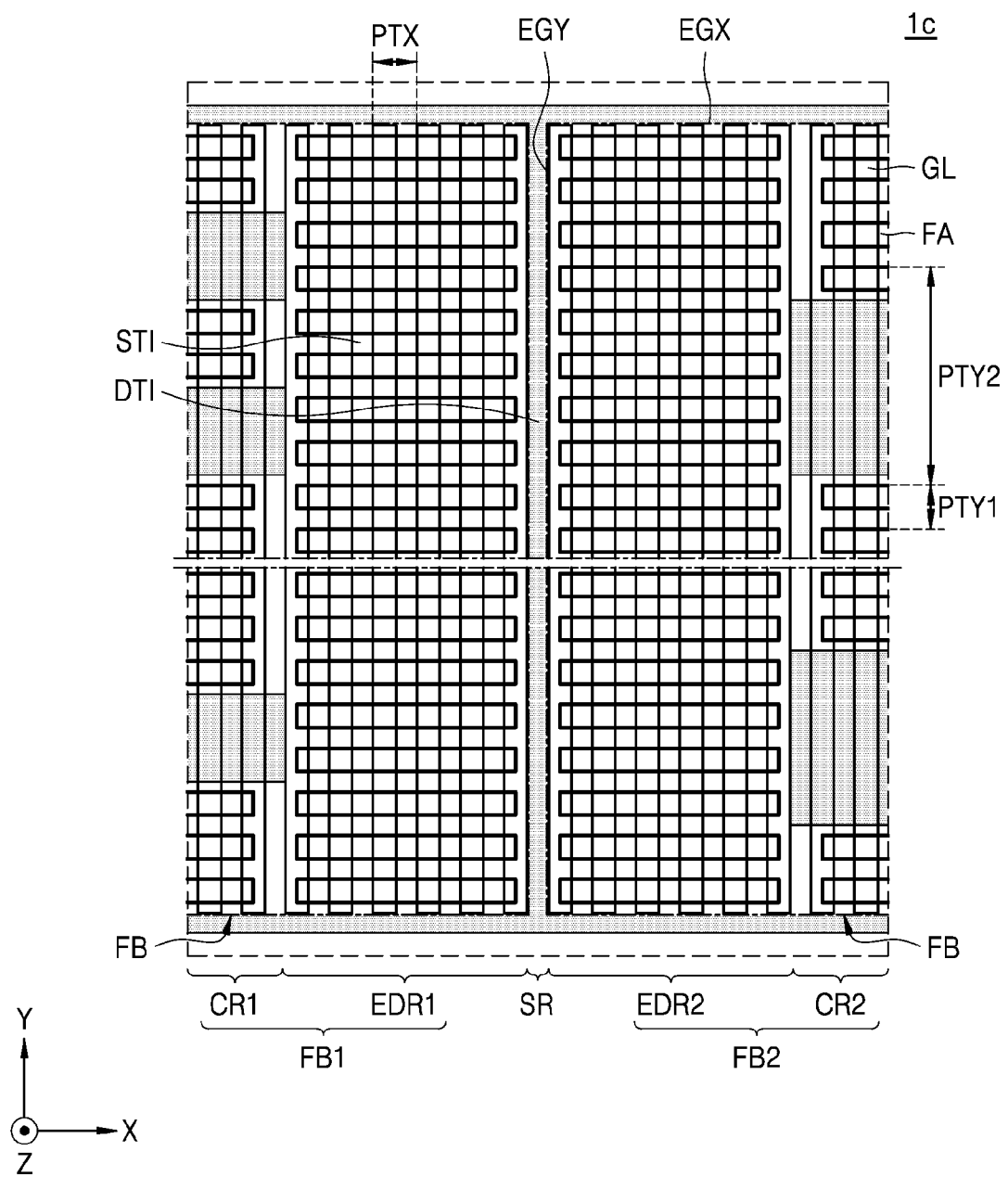
FIG. 8 is an enlarged planar layout diagram illustrating a portion of an integrated circuit device according to exemplary embodiments of the inventive concept.

FIG. 8 is an enlarged planar layout diagram illustrating a portion of an integrated circuit device according to exemplary embodiments of the inventive concept. FIG. 8 is an enlarged planar layout diagram illustrating respective portions of two function blocks FB which are adjacent to each other and have been shown in FIGS. 1 and 2, and regarding FIG. 8, the same reference numerals as in FIGS. 1, 2, 5, and 7 denote substantially the same members and repeated descriptions given with reference to FIGS. 1, 2, 5, and 7 may be omitted.

Referring to FIG. 8, an integrated circuit device 1c may have the plurality of function blocks FB defined by the separation region SR. Each of the plurality of function blocks FB may include the cell region CR and the edge dummy region EDR that is arranged along a portion of the edge of the function block FB. The edge dummy region EDR may include a plurality of edge dummy regions EDR arranged apart from each other along the second edge EGY of the function block FB. For the convenience of description, it is assumed that the integrated circuit device 1b includes a first function block FB1 and a second function block FB2. The first function block FB1 may include a first cell region CR1 and a first edge dummy region EDR1 that is arranged along a portion of the edge of the first function block FB1. The second function block FB2 may include a second cell region CR2 and a second edge dummy region EDR2 that is arranged along a portion of the edge of the first function block FB1. In an exemplary embodiment, the first edge dummy region EDR1 may include a plurality of edge dummy regions spaced apart from each other along the second edge EGY of the first function block FB1. In an exemplary embodiment, the second dummy region EDR2 may include a plurality of edge dummy regions spaced apart from each other along the second edge EGY of the second function block FB2.

The first dummy region EDR1 may be spaced apart from the second dummy region EDR2 in the first horizontal direction (X direction).

The second device isolation film DTI may be arranged between the mutually-facing respective second edges EGY of the two adjacent function blocks FB. As compared with FIG. 7, the second device isolation film DTI forming one body may be arranged between the mutually-facing respective second edges EGY of the two adjacent function blocks FB in the integrated circuit device 1c. In an exemplary embodiment, a portion of the second device isolation film DTI may be arranged between the first function block FB1 and the second function block FB2 adjacent thereto. For example, the second device isolation film DTI may be arranged between the second edge EGY of the first function block FB1 and the second edge EGY, adjacent thereto, of the second function block FB2. In FIG. 7, the second device isolation film DT1 of the first function block FB1 and the second device isolation DT1 of the second function block FB2 are separated from each other. However, the integrated circuit device 1c of FIG. 8 may include the second device isolation film DTI that is formed in a single body, and the portion of the second device isolation film DTI may be arranged between the first function block FB1 and the second function block FB2.

Figure 9:
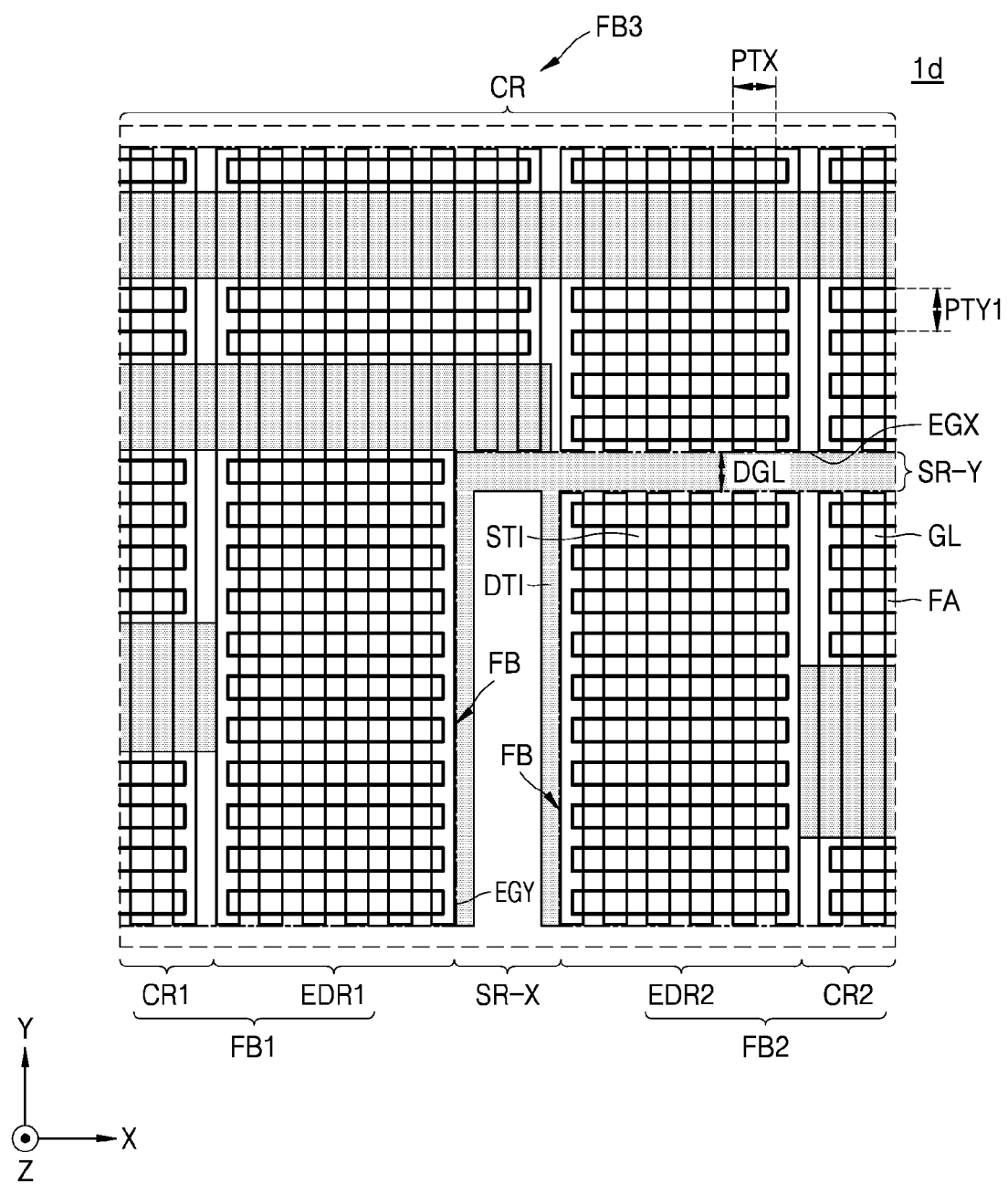
FIG. 9 is an enlarged planar layout diagram illustrating a portion of an integrated circuit device according to exemplary embodiments of the inventive concept.

FIG. 9 is an enlarged planar layout diagram illustrating a portion of an integrated circuit device according to exemplary embodiments of the inventive concept. FIG. 9 is an enlarged planar layout diagram illustrating respective portions of two adjacent function blocks FB in which at least two of the first edges EGX and the second edges EGY shown in FIG. 2 respectively face at least two other corresponding same-type edges, and regarding FIG. 9, the same reference numerals as in FIGS. 2, 5, 7, and 8 respectively denote substantially the same members and repeated descriptions given with reference to FIGS. 2, 5, 7, and 8 may be omitted.

Referring to FIG. 9, an integrated circuit device 1d may have the plurality of function blocks FB defined by separation regions SR-X and SR-Y. Each of the plurality of function blocks FB may include the cell region CR and the edge dummy region EDR that is arranged along a portion of the edge of the function block FB. The edge dummy region EDR may include a plurality of edge dummy regions EDR arranged apart from each other along the second edge EGY of the function block FB. For the convenience of description, it is assumed that the integrated circuit device 1d includes three function blocks such as a first function block FB1, a second function block FB2 and a third function block FB3. Each of the three function blocks FB1 to FB3 may include a cell region CR and an edge dummy region EDR that is arranged along a portion of the edge of a respective function block. The edge dummy region EDR of the first function block FB1 may be spaced apart from that of the second function block FB2 by a second separation region SR-X. The edge dummy region EDR of the second function block FB1 may be spaced apart from that of the third function block FB3 by a first separation region SR-Y. The edge dummy region EDR of each of the three function blocks FB1 to FB3 may be along the second edge EGY thereof.

The separation regions SR-X and SR-Y may include a first separation region SR-Y, which is a portion between mutually-facing respective first edges EGX of two adjacent function blocks FB, and a second separation region SR-X, which is a portion between mutually-facing respective second edges EGY of the two adjacent function blocks FB. In an exemplary embodiment, the first separation region SR-Y may be a portion between the first edge EGX of the second function block FB2 and the first edge EGX of the third function block FB3 adjacent thereto in the second horizontal direction (Y direction). The second separation region SR-X may be a portion between the second edge EGY of the first function block FB1 and the second edge EGY of the second function block FB2 adjacent thereto in the first horizontal direction (X direction).

The second device isolation film DTI extending to surround one of the mutually-facing respective first edges EGX of the two adjacent function blocks FB may be spaced apart from the second device isolation film DTI extending to surround the other one. That is, two second device isolation films DTI spaced apart from each other may be arranged in the second separation region SR-X. The second device isolation film DTI forming one body may be arranged between the mutually-facing respective first edges EGX of the two adjacent function blocks FB. That is, one second device isolation film DTI forming one body may be arranged in the first separation region SR-Y. In an exemplary embodiment, the second device isolation film DTI may include a first part extending along the first edge EGX of the second function block FB2 and the first edge EGX of the third function FB3, a second part extending along the second edge EGY of the first function block FB1 and a third part extending along the second edge EGY of the second function block FB2. For example, the second part and the third part of the second device isolation film DTI may be spaced apart from each other with the second separation region SR-X therebetween. The first part of the second device isolation film DTI may be arranged between the second function block FB2 and the third function block FB3. For example, the first part of the second device isolation film DTI may be arranged in the first separation region SR-Y. In an exemplary embodiment, the first part, the second part and the third part may be connected to each other to form a single body of the second device isolation film DTI.

Figure 10:
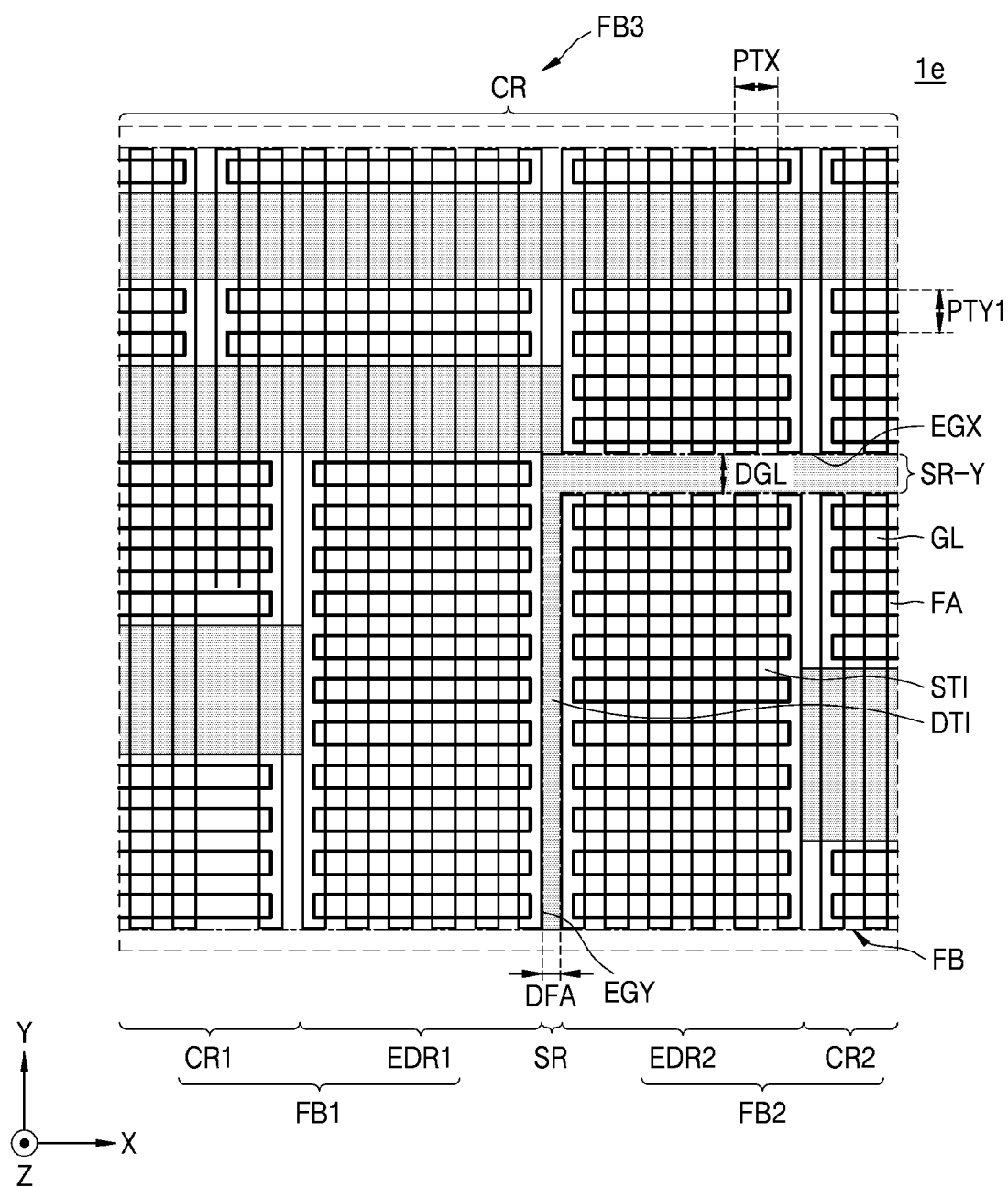
FIG. 10 is an enlarged planar layout diagram illustrating a portion of an integrated circuit device according to exemplary embodiments of the inventive concept.

FIG. 10 is an enlarged planar layout diagram illustrating a portion of an integrated circuit device according to exemplary embodiments of the inventive concept. FIG. 10 is an enlarged planar layout diagram illustrating a portion of each of two adjacent function blocks FB in which at least two of the first edges EGX and the second edges EGY shown in FIG. 2 respectively face at least two other corresponding same-type edges, and regarding FIG. 10, the same reference numerals as in FIGS. 2, 5, 7, 8, and 9 denote substantially the same members and repeated descriptions given with reference to FIGS. 2, 5, 7, 8, and 9 may be omitted.

Referring to FIG. 10, an integrated circuit device 1e may have the plurality of function blocks FB defined by separation regions SR-X and SR-Y. Each of the plurality of function blocks FB may include the cell region CR and the edge dummy region EDR that is arranged along a portion of the edge of the function block FB. The edge dummy region EDR may include a plurality of edge dummy regions EDR arranged apart from each other along the second edge EGY of the function block FB. For the convenience of description, it is assumed that the integrated circuit device 1e includes three function blocks such as a first function block FB1, a second function block FB2, and a third function block FB3. Each of the three function blocks FB1 to FB3 may include the cell region CR and the edge dummy region EDR that is arranged along a portion of the edge of a respective function block. The edge dummy region EDR of the first function block FB1 may be spaced apart from that of the second function block FB2 by a second separation region SR-X. The edge dummy region EDR of the second function block may be spaced apart from that of the third function block FB3 by a first separation region SR-Y. The edge dummy region EDR of each of the three function blocks FB1 to FB3 may be along the second edge EGY thereof.

The second device isolation film DTI forming one body may be arranged between mutually-facing respective second edges EGY of two adjacent function blocks FB. That is, one second device isolation film DTI forming one body may be arranged in the second separation region SR-X. The second device isolation film DTI forming one body may be arranged between mutually-facing respective first edges EGX of the two adjacent function blocks FB. That is, one second device isolation film DTI forming one body may be arranged in the first separation region SR-Y. In an exemplary embodiment, the second device isolation film DTI may include a first part extending along the first edge EGX of each of the second function block FB2 and the third function block FB3, and a second part extending along the second edge EGY of each of the first function block FB1 and the second function block FB2. The first part and the second part may be connected to each other to form one body of the second device isolation film DTI. For example, the first part may be arranged in the second separation region SR-X disposed between respective second edges EGY of two adjacent function blocks FB1 and FB2, and the second part may be arranged in the first separation region SR-Y disposed between respective first edges EGX of two adjacent function blocks FB2 and FB3. The second device isolation film DTI forming one body may be arranged in the first separation region SR-Y and the second separation region SR-X.

Referring together to FIGS. 9 and 10, because, in the integrated circuit devices 1d and 1e according to exemplary embodiments of the inventive concept, the plurality of dummy gate lines GL may be uniformly formed, there is no need to arrange, in the second separation region SR-X, a separate structure for securing the uniformity of the plurality of dummy gate lines GL. Therefore, even when a second hardmask pattern (HM2 of FIG. 15) for forming the plurality of gate lines GL is formed by a pattern density increasing technology using a spacer, such as Double Patterning Technology (DPT) or Quadruple Patterning Technology (QPT), because the second hardmask pattern HM2 for forming the plurality of dummy gate lines GL included in at least two adjacent function blocks FB may also be formed by the pattern density increasing technology using a spacer, a trimming process for removing unnecessary portions of the spacer may not be performed on the first separation region SR-Y. Therefore, a first gap DGL between ends of the plurality of gate lines GL, which face each other with the first separation region SR-Y therebetween, may be minimized. For example, the first gap DGL may have a value that is greater than the first pitch PTY1 and less than twice the first pitch PTY1.

Referring to FIG. 10, because, in the integrated circuit device 1e according to exemplary embodiments of the inventive concept, the plurality of dummy gate lines GL may be uniformly formed, there is no need to arrange, in the second separation region SR-X, a separate structure for securing the uniformity of the plurality of dummy gate lines GL. Therefore, a second gap DFA between ends of the plurality of fin-type active regions FA, that is, ends of the plurality of dummy fin-type active regions FA, which face each other with the second separation region SR-X therebetween, may be minimized. For example, the second gap DFA may have a value that is greater than the second pitch PTX and less than twice the second pitch PTX.

Figure 17:
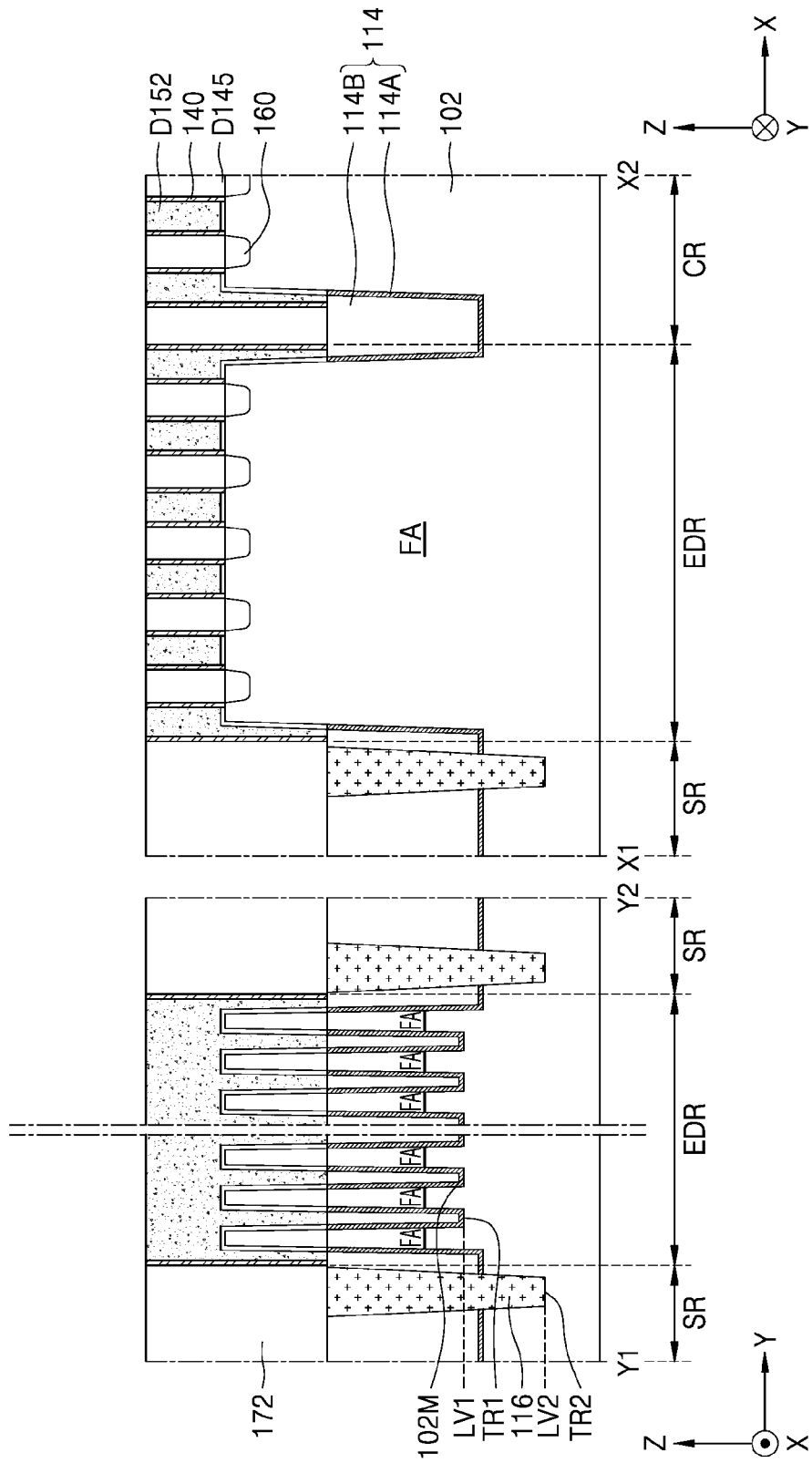
Figure 18:
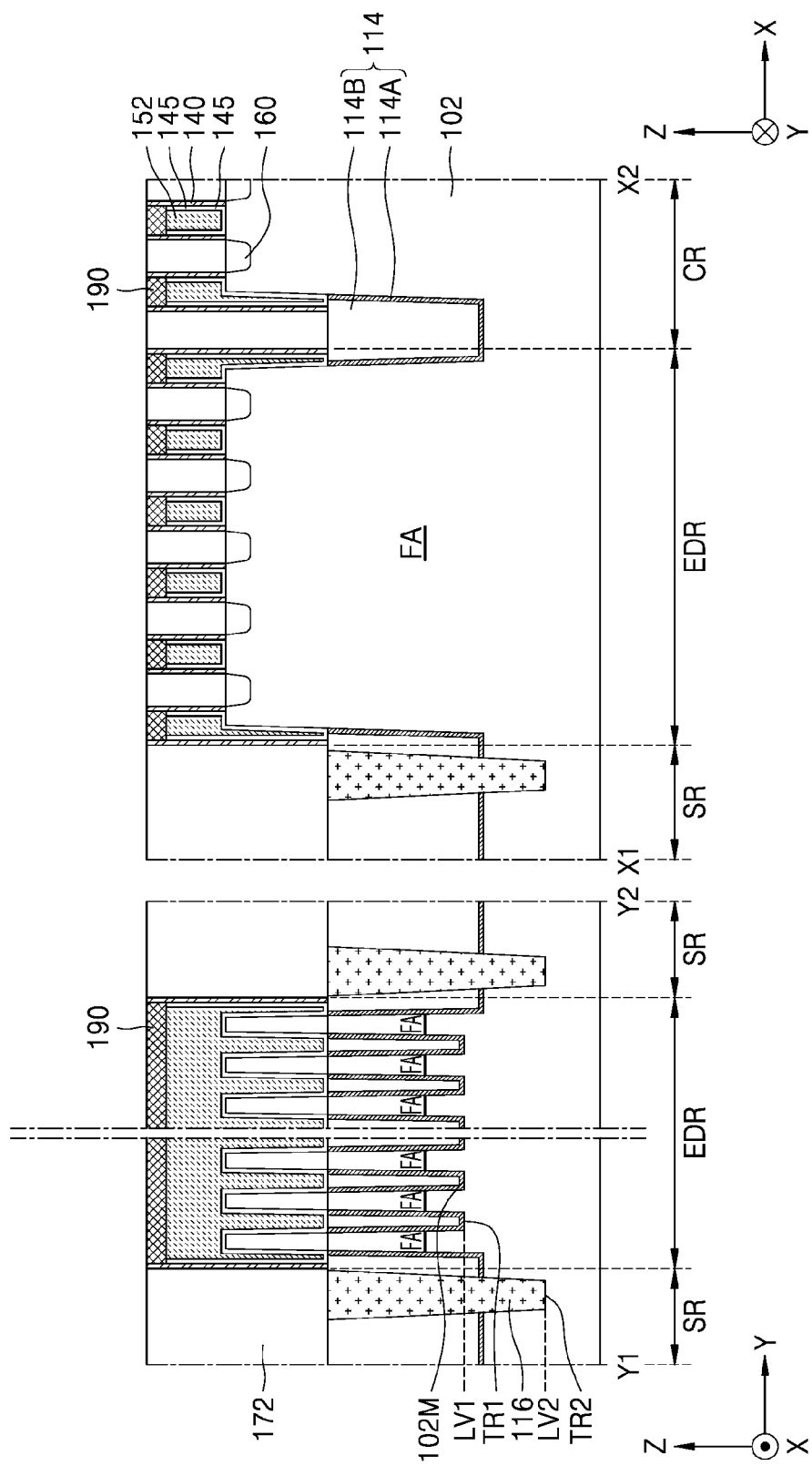
Figure 19:
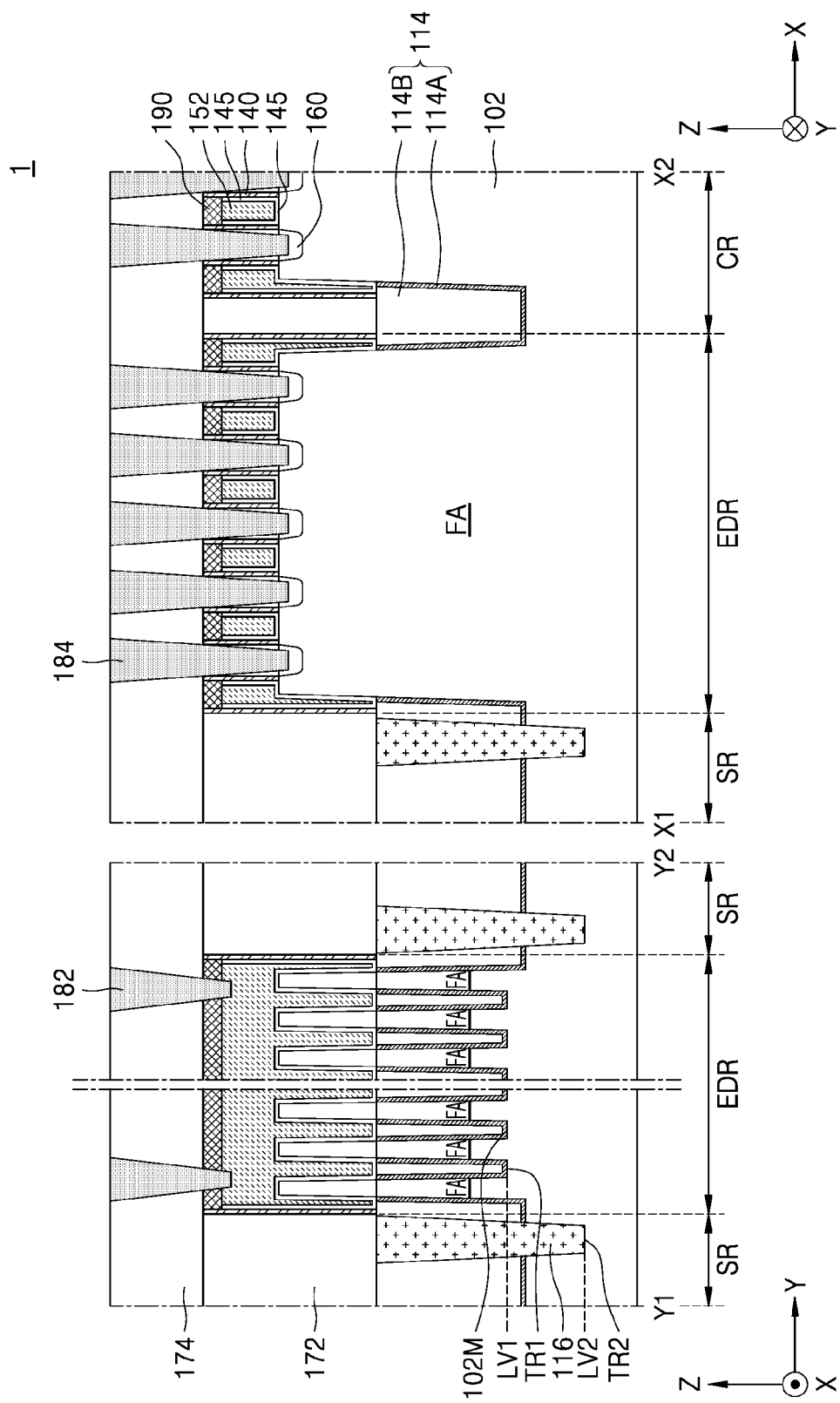
FIG. 19 is a cross-sectional view illustrating an integrated circuit device according to an exemplary embodiment of the inventive concept.

FIGS. 11 to 18 are cross-sectional views illustrating sequential processes of a method of manufacturing an integrated circuit device, according to exemplary embodiments of the inventive concept, and FIG. 19 is a cross-sectional view illustrating an integrated circuit device according to an exemplary embodiment of the inventive concept. FIGS. 11 to 19 each illustrate example cross-sectional views respectively taken along lines corresponding to lines X1-X2 and Y1-Y2 of FIG. 5.

Figure 11:
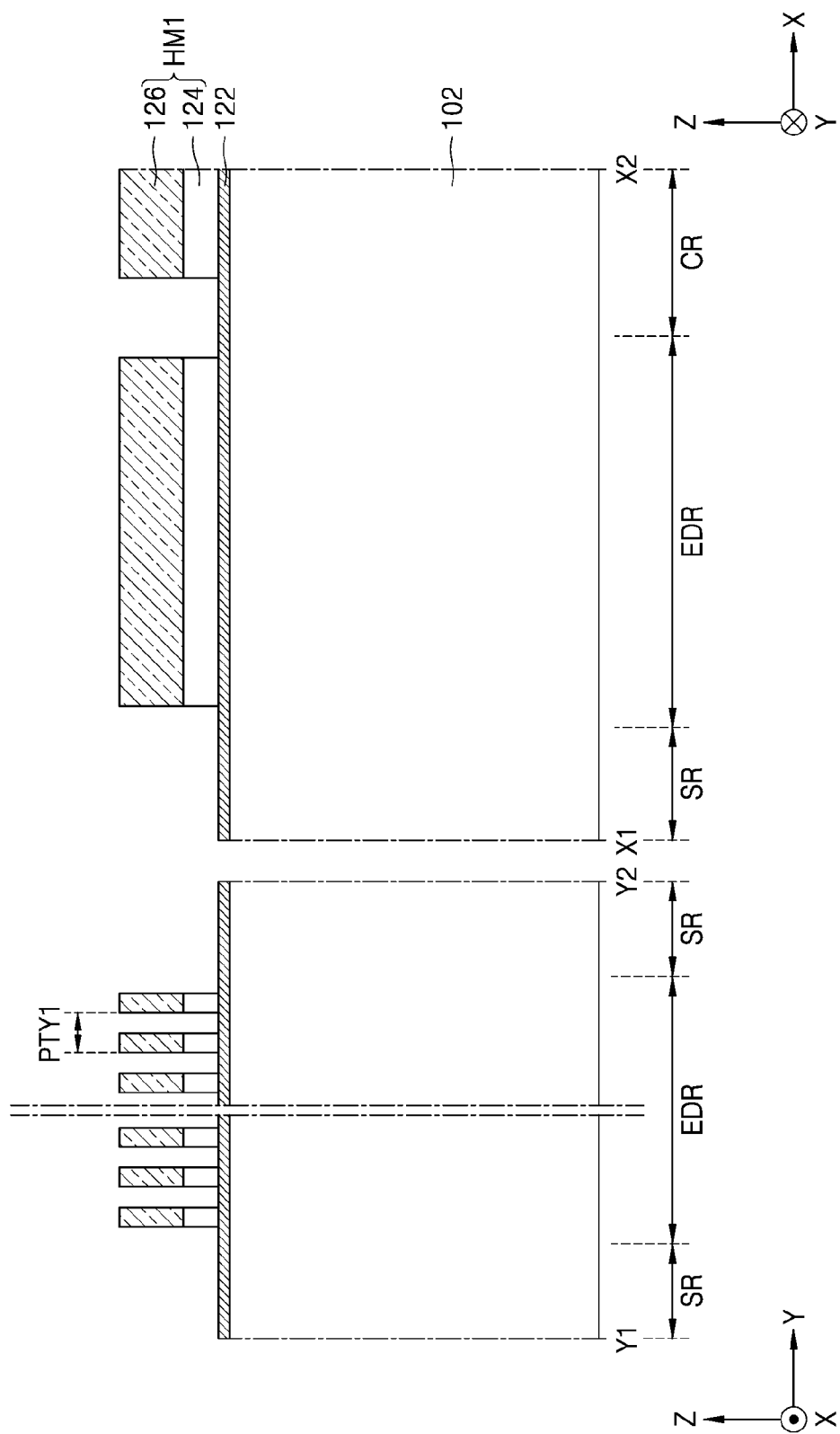
FIGS. 11 to 18 are cross-sectional views illustrating sequential processes of a method of manufacturing an integrated circuit device, according to exemplary embodiments of the inventive concept.

Referring to FIG. 11, a plurality of first hardmask patterns HM1 are formed over a substrate 102 on which a buffer layer 122 is formed.

The substrate 102 may have an edge dummy region EDR and a separation region SR. The substrate 102 may include a semiconductor material such as Si or Ge, or a compound semiconductor material such as SiGe, SiC, GaAs, InAs, or InP. The substrate 102 may include a conductive region, for example, an impurity-doped well or an impurity-doped structure. The buffer layer 122 may include an insulating material. For example, the buffer layer 122 may include oxide, nitride, or oxynitride.

The plurality of first hardmask patterns HM1 may be formed on the cell region CR and the edge dummy region EDR. The plurality of first hardmask patterns HM1 may each have a stack structure including a first layer 124 and a second layer 126 on the first layer 124. In some exemplary embodiments, the plurality of first hardmask patterns HM1 may be formed by a pattern density increasing technology using a spacer, such as DPT or QPT. Each of the first layer 124 and the second layer 126 may include an insulating material such as oxide, nitride, oxynitride, polysilicon, and a carbon-containing film. In an exemplary embodiment, the first layer 124 may include an insulating material different from that of the second layer 126. The carbon-containing film may include a spin-on-hardmask (SOH) material. The SOH material may include a hydrocarbon compound or a derivative thereof, in which carbon is present in a relatively high amount of about 85% by weight (wt %) to about 99 wt % based on a total weight of the SOH material.

The plurality of first hardmask patterns HM1 may be formed to extend parallel to each other in the first horizontal direction (X direction). In the edge dummy region EDR, the plurality of first hardmask patterns HM1 may be arranged parallel to each other and equally spaced apart from each other with the first pitch PTY1 in the second horizontal direction (Y direction). In the edge dummy region EDR, the plurality of first hardmask patterns HM1 may have the same length in the first horizontal direction (X direction).

Figure 12:
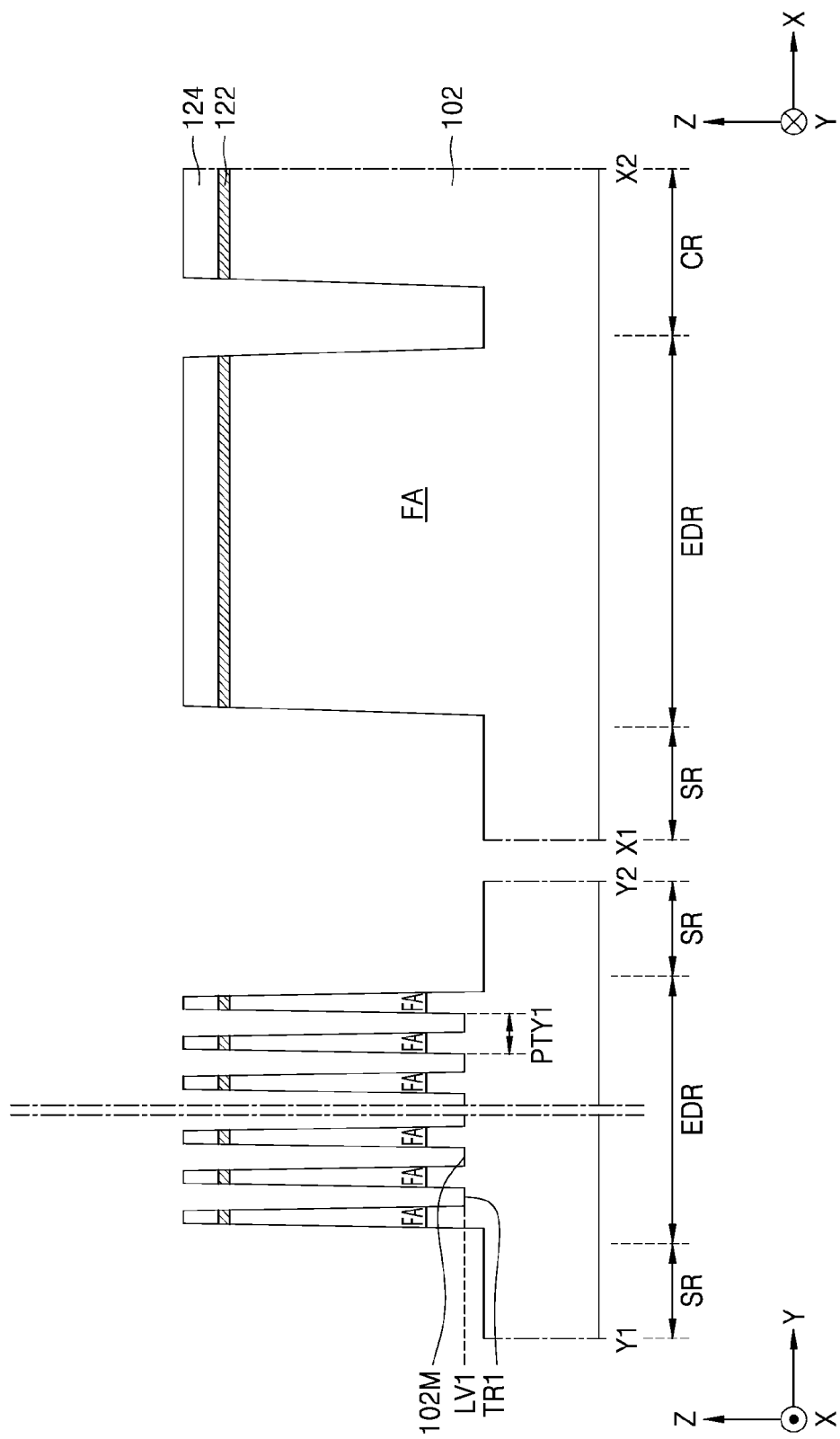

Referring to FIGS. 11 and 12, a portion of the substrate 102 is removed by using the plurality of first hardmask patterns HM1 as an etch mask, thereby forming a plurality of fin-type active regions FA, which are defined by a first trench TR1 and protrude from a main surface 102M of the substrate 102. The main surface 102M of the substrate 102 may extend in horizontal directions (X-Y plane direction) at a first vertical level LV1. In an exemplary embodiment, the first trench TR1 may include a first bottom surface between two hardmask patterns adjacent to each other and a second bottom surface located outside of the outermost hardmask pattern. The second bottom surface is lower than the first bottom surface. Between two fin-type active regions FA spaced apart from each other with the first pitch PTY1, the first bottom surface of the first trench TR1 and the main surface 102M of the substrate 102 may be at the first vertical level LV1.

In some embodiments, the second bottom surface of the first trench TR1 may be at a lower level than the first vertical level LV1.

During the formation of the plurality of fin-type active regions FA, a portion of each first hardmask pattern HM1, and a portion of the buffer layer 122, which corresponds to the first trench TR1, may be removed together with the portion of the substrate 102. During the formation of the plurality of fin-type active regions FA, the portion of each first hardmask pattern HM1, for example, the second layer 126, may be removed.

Figure 13:
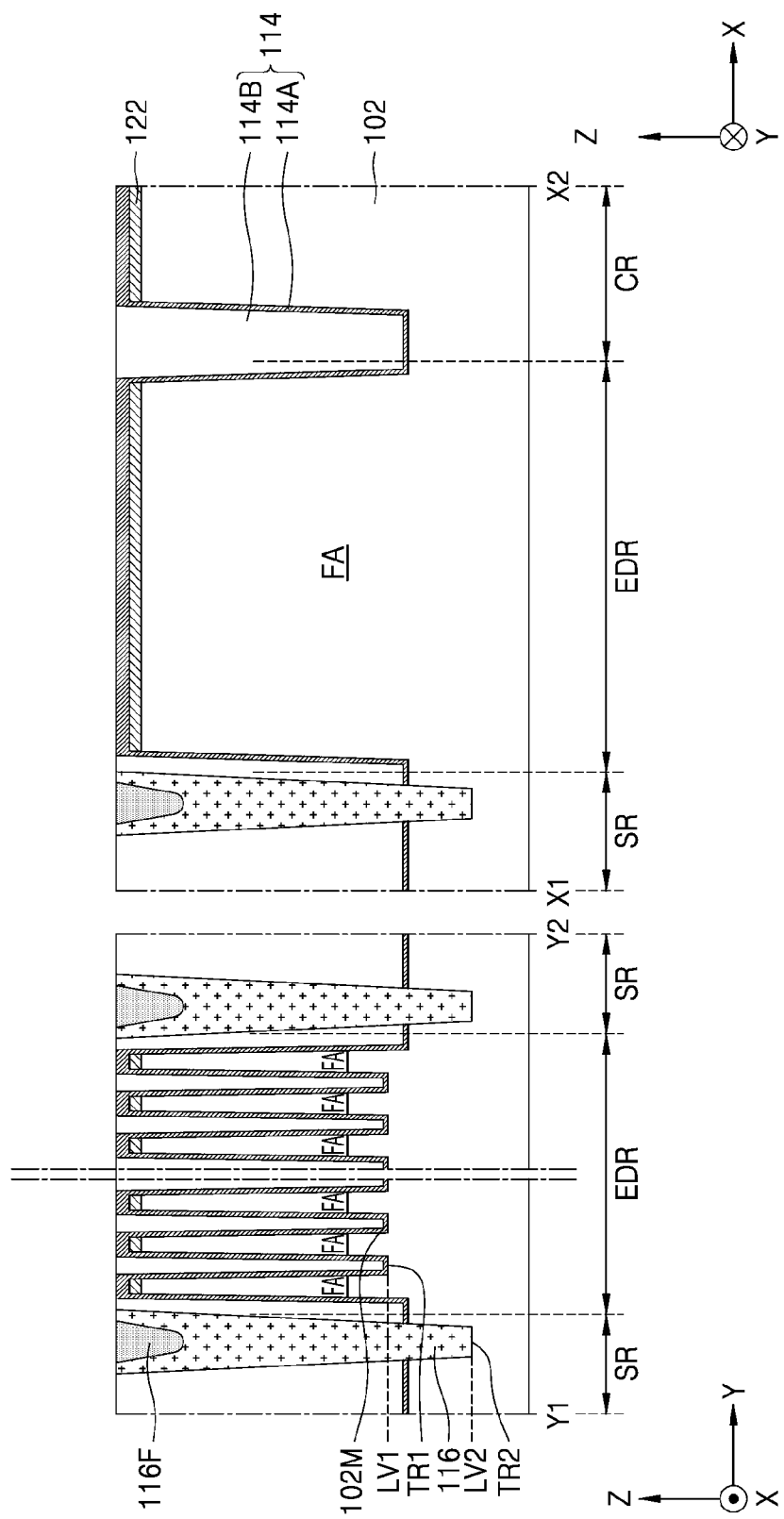

Referring to FIG. 13, a first device isolation film 114 including a liner layer 114A and a first trench filling layer 114B is formed, the liner layer 114A covering the bottom surface and an inner side surface of the first trench TR1 and a top surface of the substrate 102, and the first trench filling layer 114B filling the inside of the first trench TR1. In some exemplary embodiments, the liner layer 114A may include oxide, nitride, or oxynitride. For example, the liner layer 114A may include, but is not limited to, silicon oxide formed by thermal oxidation, silicon nitride (SiN), silicon oxynitride (SiON), silicon boronitride (SiBN), silicon carbide (SiC), SiC:H, SiCN, SiCN:H, SiOCN, SiOCN:H, silicon oxycarbide (SiOC), polysilicon, or a combination thereof. The first trench filling layer 114B may include oxide formed by a deposition process or a coating process. For example, the first trench filling layer 114B may include, but is not limited to, fluoride silicate glass (FSG), undoped silicate glass (USG), boro-phospho-silicate glass (BPSG), phospho-silicate glass (PSG), flowable oxide (FOX), plasma enhanced tetraethyl-ortho-silicate (PE-TEOS), or tonen silazene (TOSZ). The first trench filling layer 114B may be formed by forming a preliminary trench filling layer, which fills the first trench TR1 and covers the top surface of the substrate 102, followed by removing a portion of the preliminary trench filling layer, which has a higher level than the top surface of the substrate 102. To form the first trench filling layer 114B, in some exemplary embodiments, during the removal of the portion of the preliminary trench filling layer, the buffer layer 122 may be used as an etch stop layer, and the first layer (124 of FIG. 12) may be removed together with the portion of the preliminary trench filling layer.

After the first device isolation film 114 is formed, a portion of the first device isolation film 114 and a portion of the substrate 102 are removed, thereby forming a second trench TR2, which has a bottom surface at a second vertical level LV2 lower than the first vertical level LV1. Next, a second device isolation film 116 is formed to fill at least a portion of the second trench TR2. In some exemplary embodiments, the second device isolation film 116 may partially fill the second trench TR2, and a second trench filling layer 116F may be further formed to fill the remaining portion of the second trench TR2, which is not filled with the second device isolation film 116. The second device isolation film 116 may include oxide. The second trench filling layer 116F may include oxide. In an exemplary embodiment, the oxide of the second device isolation film 116 and the oxide of the second trench filling layer 116F may be the same or different.

Figure 14:
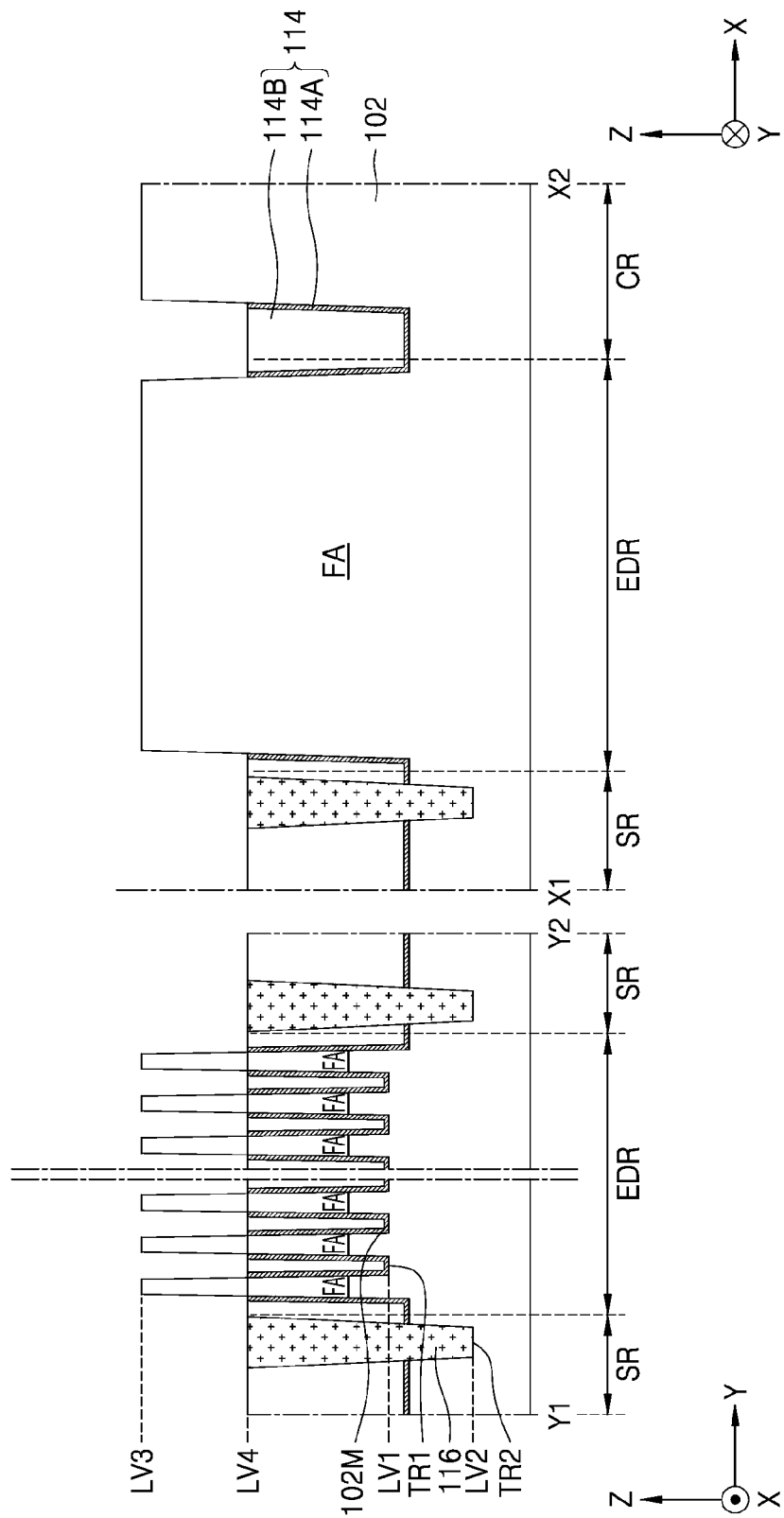

Referring to FIG. 14, an upper portion of each of the first device isolation film 114 and the second device isolation film 116 is removed such that a top surface of the first device isolation film 114 and a top surface of the second device isolation film 116 are at a fourth vertical level LV4 which is higher than the first vertical level LV1 of the main surface 102M and lower than a third vertical level LV3 of a top surface of each fin-type active region FA. The first device isolation film 114 and the second device isolation film 116 may respectively correspond to the first device isolation film STI and the second device isolation film DTI, which are shown in FIG. 5. A bottom surface of the first device isolation film 114 may be at the first vertical level LV1, and a bottom surface of the second device isolation film 116 may be at the second vertical level LV2 lower than the first vertical level LV1.

The plurality of fin-type active regions FA may protrude, in fin shapes, upward from the first device isolation film 114. The first device isolation film 114 may cover lower portions of sidewalls of the plurality of fin-type active regions FA.

Figure 15:
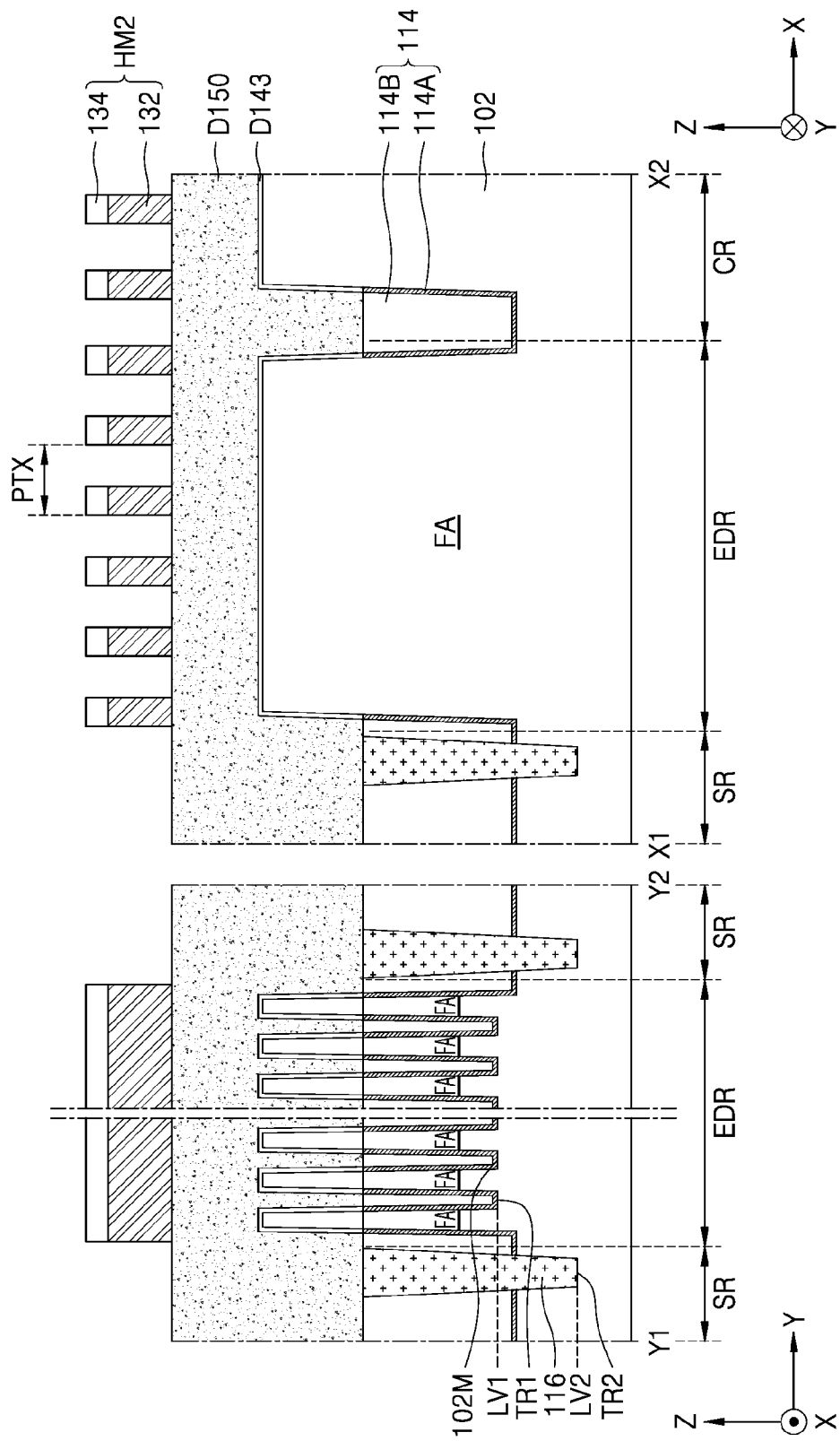

Referring to FIG. 15, a sacrificial gate insulating material layer D143, which covers surfaces of the plurality of fin-type active regions FA protruding upward from the first device isolation film 114, and a sacrificial gate material layer D150, which covers the sacrificial gate insulating material layer D143, are formed.

The sacrificial gate insulating material layer D143 may include, for example, oxide. In some exemplary embodiments, the sacrificial gate insulating material layer D143 may be formed, by a thermal oxidation process, to conformally cover the surfaces of the plurality of fin-type active regions FA protruding upward from the first device isolation film 114.

The sacrificial gate material layer D150 may include, for example, polysilicon. The sacrificial gate material layer D150 may be formed with a sufficient thickness such that a top surface of the sacrificial gate material layer D150 is at a higher level than the top surfaces of the plurality of fin-type active regions FA.

A plurality of second hardmask patterns HM2 may be formed on the sacrificial gate material layer D150. The plurality of second hardmask patterns HM2 may be formed on the cell region CR and the edge dummy region EDR. The plurality of second hardmask patterns HM2 may each have a stack structure including a third layer 132 and a fourth layer 134 on the third layer 132. In some exemplary embodiments, the plurality of second hardmask patterns HM2 may be formed by a pattern density increasing technology using a spacer, such as DPT or QPT. In some exemplary embodiments, each of the third layer 132 and the fourth layer 134 may include an insulating material including oxide, nitride, oxynitride, polysilicon, or a carbon-containing film. In an exemplary embodiment, the insulating material of the third layer 132 and the insulating material of the fourth layer 134 may be different. The carbon-containing film may include an SOH material. The SOH material may include a hydrocarbon compound or a derivative thereof, in which carbon is present in a relatively high amount of about 85 wt % to about 99 wt % based on a total weight of the SOH material. In some exemplary embodiments, the third layer 132 may include polysilicon or an insulating material such as oxide, nitride, oxynitride, or a carbon-containing film.

The plurality of second hardmask patterns HM2 may be formed to extend parallel to each other in the second horizontal direction (Y direction). In the edge dummy region EDR, the plurality of second hardmask patterns HM2 may be arranged parallel to each other and equally spaced apart from each other with the second pitch PTX in the first horizontal direction (X direction). In the edge dummy region EDR, the plurality of second hardmask patterns HM2 may have the same length in the second horizontal direction (Y direction).

Figure 16:
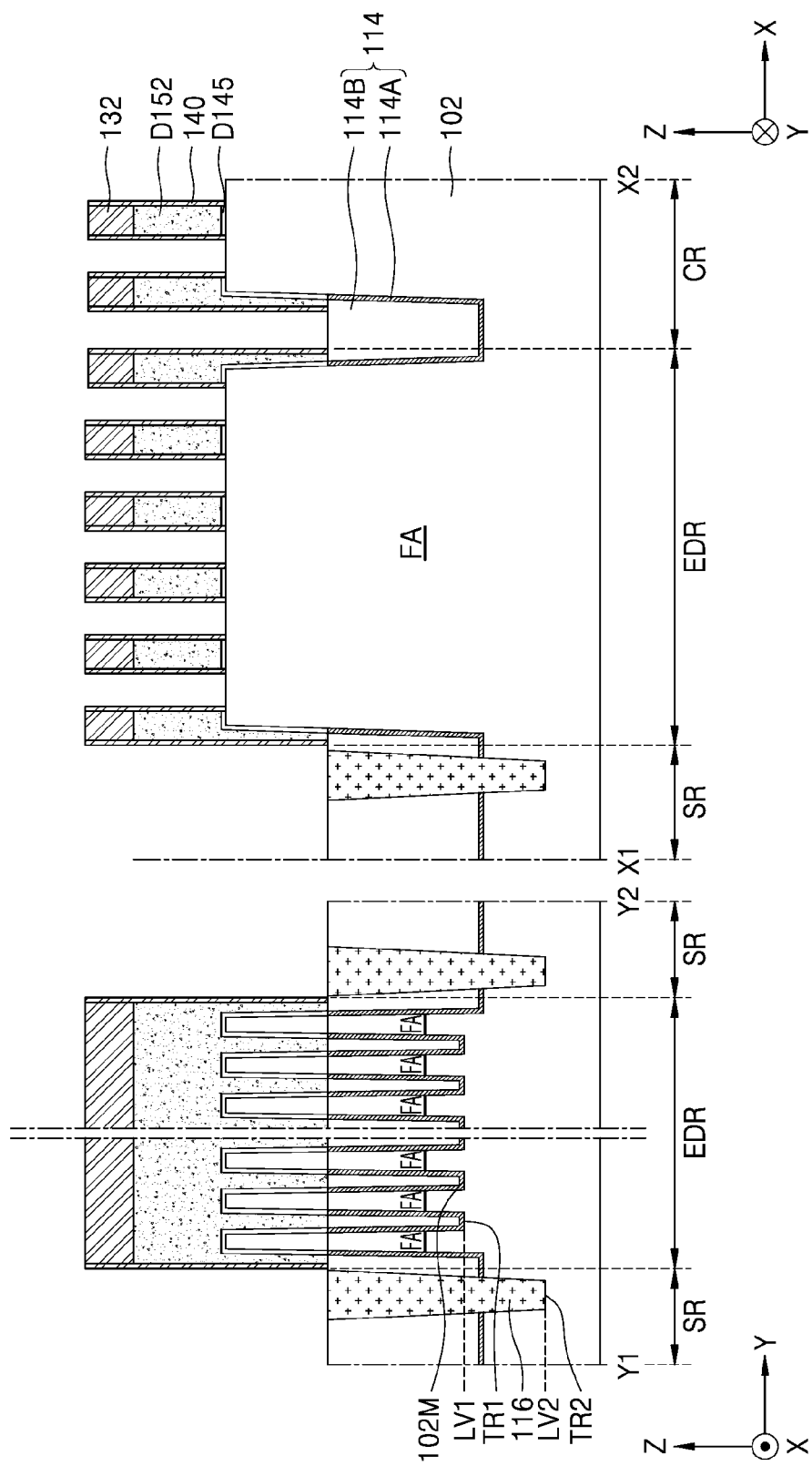

Referring together to FIGS. 15 and 16, a portion of the sacrificial gate material layer D150 and a portion of the sacrificial gate insulating material layer D143 are removed by using the plurality of second hardmask patterns HM2 as an etch mask, thereby forming a plurality of sacrificial gate lines D152 and a plurality of sacrificial gate insulating films D145. The plurality of sacrificial gate insulating films D145 may be arranged between the plurality of fin-type active regions FA and the plurality of sacrificial gate lines D152.

In some exemplary embodiments, portions of the plurality of second hardmask patterns HM2 may remain on the plurality of sacrificial gate lines D152. For example, the third layer 132 may remain on each of the plurality of sacrificial gate lines D152.

Next, a plurality of gate spacers 140 are formed to cover opposite side surfaces of stack structures including the plurality of sacrificial gate insulating films D145 and the plurality of sacrificial gate lines D152. The plurality of gate spacers 140 may each include, for example, nitride.

Referring together to FIGS. 16 and 17, a plurality of source/drain regions 160 are formed in portions of each fin-type active region FA, the portions being exposed between the stack structures, which include the plurality of sacrificial gate insulating films D145 and the plurality of sacrificial gate lines D152 and have opposite side surfaces thereof covered with the plurality of gate spacers 140. In some exemplary embodiments, the plurality of source/drain regions 160 may be formed by implanting impurities into the portions of each fin-type active region FA. In some exemplary embodiments, a plurality of recesses may be formed by removing the portions of each fin-type active region FA, the portions being exposed between the stack structures which include the plurality of sacrificial gate insulating films D145 and the plurality of sacrificial gate lines D152 and have opposite side surfaces thereof covered with the plurality of gate spacers 140, and then, the plurality of source/drain regions 160 may be formed to fill the plurality of recesses, respectively. For example, the plurality of source/drain regions 160 may each include an epitaxially grown SiGe layer, an epitaxially grown Si layer, an epitaxially grown SiC layer, or a combination thereof.

A first interlayer insulating material layer is formed to cover the stack structures which include the plurality of sacrificial gate insulating films D145 and the plurality of sacrificial gate lines D152 and have opposite side surfaces thereof covered with the plurality of gate spacers 140, and then, a first interlayer dielectric layer 172 is formed by removing an upper portion of the first interlayer insulating material layer such that top surfaces of the plurality of sacrificial gate lines D152 are exposed. The first interlayer dielectric layer 172 may include oxide, nitride, or a combination thereof. The first interlayer dielectric layer 172 may be formed by removing the upper portion of the first interlayer insulating material layer through, for example, a chemical mechanical polishing (CMP) process. To form the first interlayer dielectric layer 172, during the removal of the upper portion of the first interlayer insulating material layer, upper portions of the plurality of gate spacers 140 and the third layer 132 remaining on each of the plurality of sacrificial gate lines D152 may also be removed.

The top surfaces of the plurality of sacrificial gate lines D152, top surfaces of the plurality of gate spacers 140, and a top surface of the first interlayer dielectric layer 172 may be coplanar.

Referring together to FIGS. 17 and 18, the plurality of sacrificial gate lines D152 and the plurality of sacrificial gate insulating films D145 are removed to form spaces, and then a plurality of gate insulating films 145 are formed to cover bottom surfaces and inner side surfaces of the spaces which are between the plurality of gate spacers 140 and a plurality of gate lines 152 are formed to cover the plurality of gate insulating films 145. The plurality of gate lines 152 may fill the spaces formed after the removal of the plurality of sacrificial gate lines D152 and the plurality of sacrificial gate insulating films D145. The plurality of gate lines 152 may correspond to the plurality of gate lines GL shown in FIG. 5. For the convenience of description, the plurality of gate lines 152 may be used without identifying whether each gate line is a real gate line or a dummy gate line. A gate line 152 on the dummy region EDR is referred to as a dummy gate line, and a gate line 152 on the cell region CR is referred to as a real gate line.

The plurality of gate insulating films 145 and the plurality of gate lines 152 may each be formed by an atomic layer deposition (ALD) process, a chemical vapor deposition (CVD) process, a physical vapor deposition (PVD) process, a metal organic ALD (MOALD) process, or a metal organic CVD (MOCVD) process.

The plurality of gate insulating films 145 may each include a silicon oxide film, a high-K dielectric film, or a combination thereof. The high-K dielectric film may include an insulating material having a dielectric constant greater than that of the silicon oxide film. The high-K dielectric film may include metal oxide or metal oxynitride. An interfacial film may be arranged between each fin-type active region FA and each gate insulating film 145. The interfacial film may include an oxide film, a nitride film, or an oxynitride film.

The plurality of gate lines 152 may each have a structure in which a metal nitride layer, a metal layer, a conductive capping layer, and a gap-fill metal film are sequentially stacked in this stated order. Each of the metal nitride layer and the metal layer may include at least one metal selected from among Ti, Ta, W, Ru, Nb, Mo, and Hf. The gap-fill metal film may include a W film or an Al film. Each of the plurality of gate lines 152 may include a work function metal-containing layer. The work function metal-containing layer may include at least one metal selected from among Ti, W, Ru, Nb, Mo, Hf, Ni, Co, Pt, Yb, Tb, Dy, Er, and Pd. In some exemplary embodiments, each of the plurality of gate lines 152 may include, but is not limited to, a stack structure of TiAlC/TiN/W, a stack structure of TiN/TaN/TiAlC/TiN/W, or a stack structure of TiN/TaN/TiN/TiAlC/TiN/W.

In some exemplary embodiments, the plurality of gate insulating films 145 and the plurality of gate lines 152 may be formed to fill only lower portions of the spaces which are between the plurality gate spacers 140 and are formed after the removal of the plurality of sacrificial gate lines D152 and the plurality of sacrificial gate insulating films D145, and then, a plurality of gate capping layers 190 may be further formed to respectively fill the remaining portions of the spaces between the plurality gate spacers 140. The plurality of gate capping layers 190 may each include, for example, a nitride film or an oxynitride film. An uppermost end of each of the plurality gate spacers 140 and a top surface of each of the plurality of gate capping layers 190 may be at the same vertical level.

Referring to FIG. 19, a second interlayer dielectric 174 is formed, and then, a plurality of first contact plugs 182 and a plurality of second contact plugs 184 are formed, the plurality of first contact plugs 182 being electrically connected to the plurality of gate lines 152 through the second interlayer dielectric 174, and the plurality of second contact plugs 184 being electrically connected to the plurality of source/drain regions 160 through the second interlayer dielectric 174 and the first interlayer dielectric layer 172. Although the plurality of first contact plugs 182 are illustrated as being electrically connected to the plurality of gate lines 152 on edge dummy regions EDR in FIG. 19, exemplary embodiments of the present inventive concept are not limited thereto or thereby. In an exemplary embodiment, the plurality of first contact plugs 182 may be electrically connected to the plurality of gate lines 152 on the cell region CR.

In some exemplary embodiments, when the plurality of gate capping layers 190 respectively cover top surfaces of the plurality of gate lines 152, the plurality of first contact plugs 182 may be electrically connected to the plurality of gate lines 152 through the second interlayer dielectric 174 and the plurality of gate capping layers 190.

The plurality of first contact plugs 182 and the plurality of second contact plugs 184 may each include a conductive barrier film and a plug material layer on the conductive barrier film. The conductive barrier film may include, for example, Ti, Ta, TiN, TaN, or a combination thereof. The plug material layer may include, for example, metal such as W, Cu, Ti, Ta, Ru, Mn, or Co, metal nitride such as TiN, TaN, CoN, or WN, or an alloy such as cobalt tungsten phosphide (CoWP), cobalt tungsten boron (CoWB), or cobalt tungsten boron phosphide (CoWBP).

In some exemplary embodiments, a silicide layer may be arranged between each of the plurality of second contact plugs 184 and each of the plurality of source/drain regions 160. The silicide layer may include, for example, tungsten silicide (WSi), titanium silicide (TiSi), cobalt silicide (CoSi), or nickel silicide (NiSi).

In the integrated circuit device 1 according to exemplary embodiments of the inventive concept, the plurality of dummy fin-type active regions FA, having the same first pitch (PTY1 of FIG. 12) and having the same length, may be disposed under the plurality of dummy gate lines 152 arranged in the edge dummy region EDR, and thus the plurality of dummy gate lines 152 may secure uniformity of line-widths and/or pitches to the extent that some of the plurality of dummy gate lines 152 may be prevented from lifting. Therefore, the integrated circuit device 1 according to exemplary embodiments of the inventive concept may prevent defects, which may be caused by lifting of the dummy gate lines GL, and thus secure reliability.

Although descriptions have been made with reference to example cross-sectional views of FIGS. 11 to 19, taken along lines X1-X2 and Y1-Y2 of FIG. 5, because it is apparent to those of ordinary skill in the art that the components formed in other areas, for example, the first device isolation film STI, the second device isolation film DTI, the plurality of fin-type active regions FA, and the plurality of gate lines GL, which are formed in the cell region (CR of FIG. 5), may also be formed by identical or similar methods, descriptions thereof will be omitted.

Although the integrated circuit device 1, which has a fin-type transistor (FinFET) including the fin-type active region FA, has been described with reference to FIGS. 11 to 19, the integrated circuit device according to the inventive concept is not limited thereto.

For example, the integrated circuit device according to the inventive concept may include a tunneling FET, a transistor including nanowires, a Multi-Bridge Channel FET (MBCFET®) that is a transistor including nanosheets, or various 3-dimensional (3D) transistors.

Figure 20:
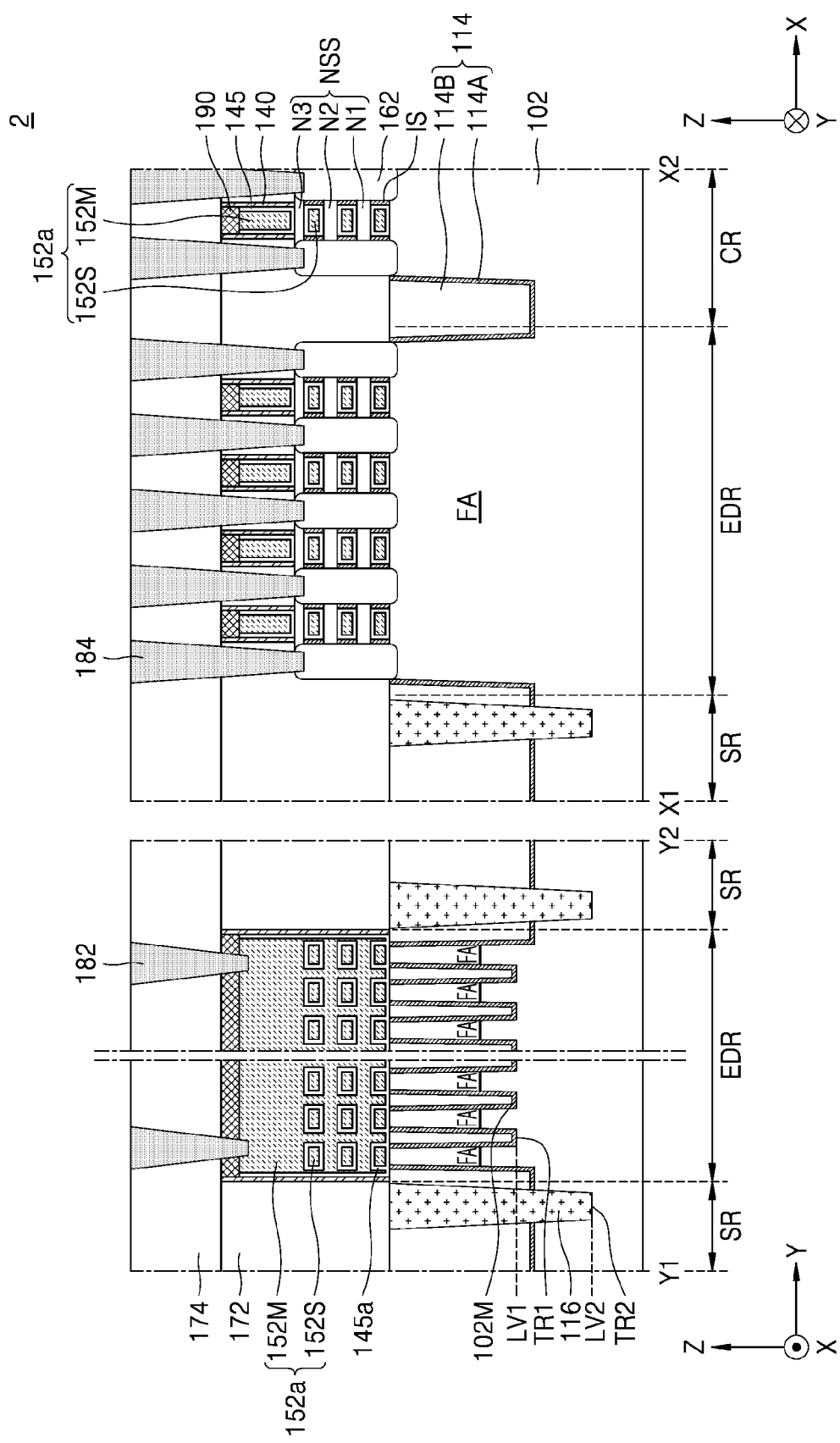
FIG. 20 is a cross-sectional view illustrating an integrated circuit device according to an exemplary embodiment of the inventive concept.

FIG. 20 is a cross-sectional view illustrating an integrated circuit device according to an exemplary embodiment of the inventive concept. For example, an integrated circuit device having a transistor including nanosheets will be described with reference to FIG. 20, and regarding FIG. 20, the same reference numerals as in FIG. 19 denote substantially the same members and repeated descriptions given with reference to FIG. 19 may be omitted.

Referring to FIG. 20, an integrated circuit device 2 includes the plurality of fin-type active regions FA, which protrude from the substrate 102 and extend in the first horizontal direction (X direction), and a plurality of nanosheet stack structures NSS, which are disposed on the top surfaces of the plurality of fin-type active regions FA and spaced apart from the top surfaces of the plurality of fin-type active regions FA. The first trench TR1, which defines the plurality of fin-type active regions FA, may be formed in the substrate 102. Lower sidewalls of the plurality of fin-type active regions FA may be covered with the first device isolation film 114, which fills a lower portion of the first trench TR1.

Each of the plurality of nanosheet stack structures NSS may include a plurality of nanosheets N1, N2, and N3 extending, over the substrate 102, parallel to the top surfaces of the plurality of fin-type active regions FA. The plurality of nanosheets N1, N2, and N3 constituting one nanosheet stack structure NSS are sequentially stacked, one by one, on the top surface of each fin-type active region FA. Although the present example illustrates that one nanosheet stack structure NSS includes three nanosheets N1, N2, and N3, the inventive concept is not limited thereto, and one nanosheet stack structure NSS may include variously selected numbers of nanosheets, as needed. Each of the plurality of nanosheets N1, N2, and N3 may have a channel region.

A plurality of gate lines 152a are arranged over the plurality of fin-type active regions FA to extend in the second horizontal direction (Y direction) intersecting the first horizontal direction (X direction). The plurality of gate lines 152a may at least partially overlap the plurality of nanosheet stack structures NSS in the vertical direction (Z direction), respectively. A gate insulating film 145a is formed between each nanosheet stack structure NSS and each gate line 152a.

Each of the plurality of gate lines 152a may include a main gate portion 152M, which covers a top surface of a nanosheet stack structure NSS, and a plurality of sub-gate portions 152S, which are connected to the main gate portion 152M and are formed in spaces between a fin-type active region FA and the plurality of nanosheets N1, N2, and N3, for example, formed respectively under the plurality of nanosheets N1, N2, and N3. A second thickness, which is a thickness of each of the plurality of sub-gate portions 152S, may be less than a first thickness, which is a thickness of the main gate portion 152M. In an exemplary embodiment, the first thickness of the main gate portion 152M and the second thickness of each of the plurality of sub-gate portions 152S each denote a size in the vertical direction (Z direction).

In some exemplary embodiments, the plurality of nanosheets N1, N2, and N3 may include a single material. In some exemplary embodiments, the plurality of nanosheets N1, N2, and N3 may include the same material as a constituent material of the substrate 102.

The plurality of source/drain regions 162 are respectively formed on the plurality of fin-type active regions FA. Each of the plurality of source/drain regions 162 is connected to one-side ends of the plurality of nanosheets N1, N2, and N3.

A gate spacer 140 is formed on each of the plurality of nanosheet stack structure NSS to cover a sidewall of each gate line 152a. The gate spacer 140 may cover a sidewall of the main gate portion 152M of each gate line 152a.

An insulating spacer IS may be arranged in spaces between the respective plurality of nanosheets N1, N2, and N3, the insulating spacer IS contacting a source/drain region 162. The insulating spacer IS may be arranged between the sub-gate portion 152S and the source/drain region 162, in spaces between the fin-type active region FA and the respective plurality of nanosheets N1, N2, and N3. In some exemplary embodiments, the insulating spacer IS may include a silicon nitride film. The insulating spacer IS may at least partially cover sidewalls of the plurality of sub-gate portions 152S, with the gate insulating film 145a disposed therebetween.

The first interlayer dielectric layer 172 and the second interlayer dielectric 174 are sequentially formed on the plurality of source/drain regions 162 in this stated order. Each of the first interlayer dielectric layer 172 and the second interlayer dielectric 174 may include, but is not limited to, a silicon oxide film.

The plurality of first contact plugs 182 may be electrically connected to the plurality of gate lines 152a through the second interlayer dielectric 174, and the plurality of second contact plugs 184 may be electrically connected to the plurality of source/drain regions 162 through the second interlayer dielectric 174 and the first interlayer dielectric layer 172. Although the plurality of first contact plugs 182 are illustrated as being electrically connected to the plurality of gate lines 152a on edge dummy regions EDR in FIG. 20, exemplary embodiments of the present inventive concept are not limited thereto or thereby. In an exemplary embodiment, the plurality of first contact plugs 182 may be electrically connected to the plurality of gate lines 152a on the cell region CR.

While the inventive concept has been particularly shown and described with reference to embodiments thereof, it will be understood that various changes in form and details may be made therein without departing from the spirit and scope of the following claims.

What is claimed is:

1. An integrated circuit device comprising:
   a substrate having an intellectual property (IP) core, which is surrounded by a separation region and has at least two first edges extending in a first horizontal direction and at least two second edges extending in a second horizontal direction that intersects the first horizontal direction, the IP core comprising a cell region and an edge dummy region that is arranged to extend along the at least two second edges;
   a plurality of fin-type active regions in the cell region, extending in the first horizontal direction;
   a plurality of dummy fin-type active regions in the edge dummy region;
   a plurality of nanosheet stack structures spaced apart from top surfaces of the plurality of fin-type active regions and the plurality of dummy fin-type active regions, and each of the plurality of nanosheet stack structures comprising a plurality of nanosheets, and disposed on each of the top surfaces of the plurality of fin-type active regions and the plurality of dummy fin-type active regions, a plurality of gate lines in the cell region, extending in the second horizontal direction, which intersects the first horizontal direction; and
   a plurality of dummy gate lines in the edge dummy region,
   wherein the edge dummy region is disposed between the separation region and the cell region, and
   wherein a length, in the second horizontal direction, of the edge dummy region is the same as a length, in the second horizontal direction, of the cell region.

2. The integrated circuit device of claim 1, further comprising:
   a plurality of gate capping layers on top surfaces the plurality of gate lines;
   a plurality of gate spacers covering sidewalls of the plurality of gate capping layers and the plurality of gate lines;
   an insulating interlayer dielectric layer covering the plurality of gate capping layers; and
   a plurality of first contact plugs electrically connected to the plurality of gate lines through the insulating interlayer dielectric layer and the plurality of gate capping layers.

3. The integrated circuit device of claim 2, wherein an uppermost end of each of the plurality of gate spacers and a top surface of each of the plurality of gate capping layers are located at the same vertical level.

4. The integrated circuit device of claim 2, further comprising:
   a plurality of source/drain regions on the plurality of fin-type active regions; and
   a plurality of second contact plugs electrically connected to the plurality of source/drain regions through the insulating interlayer dielectric layer.

5. The integrated circuit device of claim 4, wherein a lowermost end of each of the plurality of second contact plugs is located at a lower vertical level than a lowermost end of each of the plurality of first contact plugs.

6. The integrated circuit device of claim 4, wherein a lowermost end of each of the plurality of first contact plugs is located at a higher vertical level than a lowermost end of each of the plurality of first contact plugs and an uppermost end of each of the plurality of nanosheet stack structures.

7. The integrated circuit device of claim 2, wherein a lowermost end of each of the plurality of first contact plugs is located at a higher vertical level than an uppermost end of each of the plurality of nanosheet stack structures.

8. The integrated circuit device of claim 2, wherein each of the plurality of gate lines comprises a main gate portion covering a top surface of each nanosheet stack structure, and a plurality of sub-gate portions connected to the main gate portion and arranged respectively under the plurality of nanosheets.

9. The integrated circuit device of claim 8, wherein each of the plurality of gate spacers covers a sidewall of the main gate portion of each of the plurality of gate lines.

10. The integrated circuit device of claim 1, further comprising:
- a first device isolation film covering lower portions of sidewalls of the plurality of fin-type active regions and having a bottom surface at a first vertical level; and
- a second device isolation film having a bottom surface at a second vertical level that is lower than the first vertical level,
- wherein the second device isolation film extends along a first portion of an edge of the edge dummy region,
- wherein the first portion is directly adjacent to the separation region,
- wherein the first device isolation film extends along a second portion of the edge of the edge dummy region, and
- wherein the second portion is directly adjacent to the cell region.

11. The integrated circuit device of claim 1,
- wherein the IP core comprises at least two edge dummy regions, and
- wherein each of the at least two edge dummy regions is arranged to extend along a respective one of at least two second edges of the IP core.

12. An integrated circuit device comprising:
- a substrate having a plurality of intellectual property (IP) core, each of the plurality of IP core surrounded by a separation region, having at least two first edges extending in a first horizontal direction and at least two second edges extending in a second horizontal direction that intersects the first horizontal direction, and comprising a cell region and an edge dummy region that is arranged to extend along the at least two second edges;
- a plurality of dummy fin-type active regions in the edge dummy region;
- a plurality of fin-type active regions in the cell region, extending in the first horizontal direction;
- a plurality of nanosheet stack structures disposed on top surfaces of the plurality of fin-type active regions and spaced apart from the top surfaces of the plurality of fin-type active regions, each of the plurality of nanosheet stack structures comprising a plurality of nanosheets;
- a first device isolation film, which defines the plurality of fin-type active regions and the plurality of dummy fin-type active regions, and fills a lower portion of a first trench disposed between two fin-type active regions, adjacent to each other, of the plurality of fin-type active regions, and between two dummy fin-type active regions, adjacent to each other, of the plurality of dummy fin-type active regions, the first trench having a bottom surface at a first vertical level;
- a second device isolation film filling a second trench, the second trench extending through the first device isolation film and having a bottom surface at a second vertical level that is lower than the first vertical level;
- a plurality of gate lines in the cell region, extending in the second horizontal direction, which intersects the first horizontal direction; and
- a plurality of dummy gate lines in the edge dummy region, wherein the edge dummy region is disposed between the separation region and the cell region,
- wherein a length, in the second horizontal direction, of the edge dummy region is the same as a length, in the second horizontal direction, of the cell region, and
- wherein a portion of the second device isolation film between two adjacent IP cores among the plurality of IP core is formed in one body.

13. The integrated circuit device of claim 12,
- wherein the plurality of dummy fin-type active regions have the same length of a first length in the first horizontal direction, and
- wherein the plurality of dummy gate lines have the same length of a second length in the second horizontal direction.

14. The integrated circuit device of claim 13,
- wherein the plurality of gate lines includes at least two first gate lines having the same length of a third length in the second horizontal direction, the third length of the at least two first gate lines being equal to the second length of the plurality of dummy gate lines.

15. The integrated circuit device of claim 12, further comprising:
- a plurality of gate capping layers on top surfaces the plurality of gate lines; and
- a plurality of gate spacer covering sidewalls of the plurality of gate capping layers and the plurality of gate lines,
- wherein an uppermost end of each of a plurality gate spacers and a top surface of each of the plurality of gate capping layers are located at the same vertical level.

16. The integrated circuit device of claim 15, further comprising:
- a plurality of source/drain regions on the plurality of fin-type active regions;
- an insulating interlayer dielectric layer covering the plurality of gate capping layers;
- a plurality of first contact plugs electrically connected to the plurality of gate lines through the insulating interlayer dielectric layer and the plurality of gate capping layers; and
- a plurality of second contact plugs electrically connected to the plurality of source/drain regions through the insulating interlayer dielectric layer.

17. An integrated circuit device comprising:
- a substrate having a plurality of intellectual property (IP) core, each of the plurality of IP core surrounded by a separation region, having at least two first edges extending in a first horizontal direction and at least two second edges extending in a second horizontal direction that intersects the first horizontal direction, and comprising a cell region and an edge dummy region that is arranged to extend along the at least two second edges;
- a plurality of dummy fin-type active regions in the edge dummy region, and spaced apart from each other by a first pitch in the edge dummy region;
- a plurality of fin-type active regions in the cell region, extending in the first horizontal direction;
- a plurality of nanosheet stack structures disposed on top surfaces of the plurality of fin-type active regions and spaced apart from the top surfaces of the plurality of fin-type active regions, each of the plurality of nanosheet stack structures comprising a plurality of nanosheets;
- a plurality of gate lines in the cell region, extending in the second horizontal direction, which intersects the first horizontal direction;
- a plurality of dummy gate lines in the edge dummy region, and spaced apart from each other by a second pitch in the edge dummy region;
- a first device isolation film, which defines the plurality of fin-type active regions and fills a lower portion of a first trench disposed between two fin-type active regions, adjacent to each other, of the plurality of fin-type active regions, the first trench having a bottom surface at a first vertical level; and a second device isolation film filling a second trench, the second trench extending through the first device isolation film and having a bottom surface at a second vertical level that is lower than the first vertical level, wherein the edge dummy region is disposed between the separation region and the cell region, and wherein a length, in the second horizontal direction, of the edge dummy region is the same as a length, in the second horizontal direction, of the cell region, wherein the second device isolation film, in the separation region, is configured to enclose the each of the plurality of IP core and extend along each of at least two first edges and each of at least two second edges, wherein a portion of the second device isolation film between respective first edges of two adjacent IP cores among the plurality of IP cores is formed in one body, and wherein two portions of the second device isolation film, which extend to surround mutually-facing respective second edges of two adjacent IP cores among the plurality of IP core is spaced apart from each other.

18. The integrated circuit device of claim 17, further comprising:

a plurality of source/drain regions on the plurality of fin-type active regions;

a plurality of gate capping layers on top surfaces the plurality of gate lines;

a plurality of gate spacer covering sidewalls of the plurality of gate capping layers and the plurality of gate lines; and an insulating interlayer dielectric layer covering the plurality of gate capping layers, wherein an uppermost end of each of a plurality gate spacers and a top surface of each of the plurality of gate capping layers are located at the same vertical level.

19. The integrated circuit device of claim 18, further comprising:

a plurality of first contact plugs electrically connected to the plurality of gate lines through the insulating interlayer dielectric layer and the plurality of gate capping layers; and a plurality of second contact plugs electrically connected to the plurality of source/drain regions through the insulating interlayer dielectric layer, wherein a lowermost end of each of the plurality of first contact plugs is located at a higher vertical level than a lowermost end of each of the plurality of first contact plugs.

20. The integrated circuit device of claim 17, wherein, in the edge dummy region, each of the plurality of dummy fin-type active regions intersects all of the plurality of dummy gate lines, and each of the plurality of dummy gate lines intersects all of the plurality of dummy fin-type active regions, wherein the plurality of dummy fin-type active regions have the same length of a first length in the first horizontal direction, and wherein the plurality of dummy gate lines have the same length of a second length in the second horizontal direction.

* * * * *